(12) United States Patent
Tsuchihashi et al.

(10) Patent No.: US 7,923,196 B2
(45) Date of Patent: Apr. 12, 2011

(54) POSITIVE RESIST COMPOSITION AND PATTERN FORMING METHOD USING THE SAME

(75) Inventors: Toru Tsuchihashi, Shizuoka (JP); Kazuyoshi Mizutani, Shizuoka (JP); Shuji Hirano, Shizuoka (JP); Jiro Yokoyama, Shizuoka (JP); Shinichi Sugiyama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/672,329

(22) PCT Filed: Aug. 1, 2008

(86) PCT No.: PCT/JP2008/063914
§ 371 (c)(1),
(2), (4) Date: Apr. 12, 2010

(87) PCT Pub. No.: WO2009/022561
PCT Pub. Date: Feb. 19, 2009

(65) Prior Publication Data
US 2010/0248146 A1    Sep. 30, 2010

(30) Foreign Application Priority Data

Aug. 10, 2007  (JP) .................... 2007-209398
Mar. 12, 2008  (JP) .................... 2008-062943

(51) Int. Cl.
G03F 7/00    (2006.01)
G03F 7/004   (2006.01)
G03F 7/20    (2006.01)

(52) U.S. Cl. ............. 430/270.1; 430/913; 430/945

(58) Field of Classification Search ........... 430/270.1, 430/913, 945
See application file for complete search history.

(56) References Cited

U.S. PATENT DOCUMENTS

| | | | |
|---|---|---|---|
| 5,561,194 A | 10/1996 | Cornett et al. | |
| 5,679,495 A | 10/1997 | Yamachika et al. | |
| 5,994,022 A | 11/1999 | Tanabe et al. | |
| 2003/0134224 A1 * | 7/2003 | Mizutani et al. ......... | 430/270.1 |
| 2004/0038148 A1 | 2/2004 | Ohta et al. | |
| 2007/0190465 A1 | 8/2007 | Nishikawa et al. | |
| 2008/0096134 A1 * | 4/2008 | Sugimoto et al. ........ | 430/287.1 |
| 2009/0087789 A1 * | 4/2009 | Hirano et al. ............ | 430/286.1 |

FOREIGN PATENT DOCUMENTS

| | | | |
|---|---|---|---|
| EP | 1705518 A2 * | 9/2006 | |
| JP | 10-142800 A | 5/1998 | |
| JP | 3116751 B2 | 10/2000 | |
| JP | 2001-281862 A | 10/2001 | |
| JP | 2006-330368 A | 12/2006 | |
| JP | 2007-178903 A | 7/2007 | |
| WO | 2005091074 A1 | 9/2005 | |

OTHER PUBLICATIONS

International Search Report [PCT/ISA/210] issued in corresponding International Appln. No. PCT/JP2008/063914.
Written Opinion [PCT/ISA/237] issued in corresponding International Appln. No. PCT/JP2008/063914.
"Notification of Reasons for Refusal" dated Apr. 6, 2010, issued in counterpart Japanese Patent Application No. 2008-200246.

* cited by examiner

*Primary Examiner* — Amanda C. Walke
(74) *Attorney, Agent, or Firm* — Sughrue Mion, PLLC

(57) ABSTRACT

A positive resist composition comprising (A) a resin which contains all of the repeating units represented by formulae (I) to (III), and becomes soluble in an alkali developer by the action of an acid, and (B) a compound capable of generating an acid upon irradiation with an actinic ray or radiation; and a pattern forming method using the composition. A represents a group capable of decomposing and leaving by the action of an acid, each $R_1$ independently represents hydrogen or a methyl group, $R_2$ represents a phenyl group or a cyclohexyl group, m represents 1 or 2, and n represents an integer of 0 to 2. By virtue of this construction, a resist composition ensuring high resolution, good pattern profile, sufficient depth of focus, little defects after development, and sufficiently high plasma etching resistance is provided.

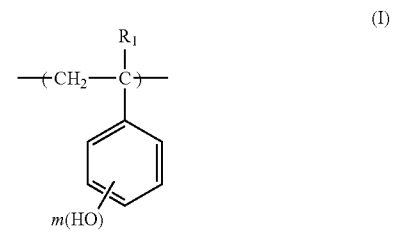

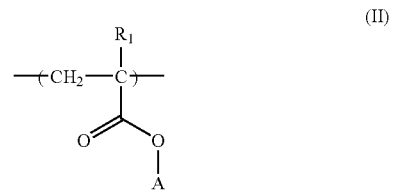

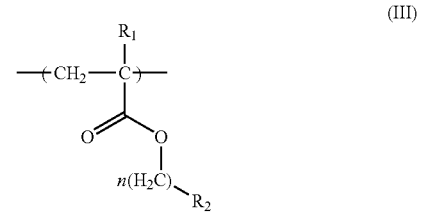

17 Claims, No Drawings

POSITIVE RESIST COMPOSITION AND PATTERN FORMING METHOD USING THE SAME

TECHNICAL FIELD

The present invention relates to a positive resist composition suitable for use in the ultramicrolithography process such as production of VLSI or a high-capacity microchip or in other photofabrication processes. More specifically, the present invention relates to a positive resist capable of forming a high-resolution pattern by using KrF excimer laser light, electron beam, EUV or the like, that is, a positive resist composition suitably usable for microprocessing of a semiconductor device, where KrF excimer laser light, electron beam or EUV light is used, and a pattern forming method using the composition.

BACKGROUND ART

In the process of producing a semiconductor device such as IC and LSI, microprocessing by lithography using a photoresist composition has been conventionally performed. Recently, the integration degree of an integrated circuit is becoming higher and formation of an ultrafine pattern in the sub-micron or quarter-micron region is required. To cope with this requirement, the exposure wavelength also tends to become shorter, for example, from g/i line to KrF excimer laser light.

In the lithography using KrF excimer laser light, it is very important to satisfy high sensitivity, high resolution, good pattern profile, good iso/dense bias and sufficient depth of focus at the same time, and this problem needs to be solved.

As regards the resist suitable for a lithography process using KrF excimer laser light, electron beam or EUV light, a chemically amplified resist utilizing an acid catalytic reaction is mainly used from the standpoint of elevating the sensitivity and in the case of a positive resist, a chemical amplification resist composition containing, as main components, an acid generator and a phenolic polymer that is insoluble or sparingly soluble in an alkali developer but becomes soluble in an alkali developer by the action of an acid (hereinafter simply referred to as a "phenolic acid-decomposable resin"), is being effectively used.

With respect to such a positive resist, several resist compositions using a phenolic acid-decomposable resin obtained by copolymerizing an acid-decomposable acrylate monomer have been heretofore known. Examples thereof include a positive resist composition disclosed in Patent Document 1.

However, a carboxylic acid is produced in the exposed area and therefore, the dissolution rate for a developer becomes excessively high, giving rise to a problem that when a resist pattern is actually formed on a substrate, the pattern top is thinned and a pattern in an ideal rectangular form is not formed. In order to solve this problem, for example, Patent Document 2 has proposed a polymer having a repeating unit capable of reducing solubility of the polymer in an alkali developer, such as methyl methacrylate and styrene.

However, when a polymer containing a repeating unit having very high hydrophobicity, such as styrene, is used for a positive resist composition, the solubility in an alkali developer excessively decreases, as a result, a defect may be readily produced.

In the case of using a repeating unit having relatively low hydrophobicity, such as methyl methacrylate, the above-described development defect can be hardly generated, but, on the other hand, the plasma etching resistance is insufficient and selective etching becomes difficult.

Patent Document 1: U.S. Pat. No. 5,561,194
Patent Document 2: Japanese Patent No. 3116751

DISCLOSURE OF THE INVENTION

Problems that the Invention is to Solve

An object of the present invention is to solve the problems in the technology for enhancing the performance at the microprocessing of a semiconductor device involving the use of an actinic ray or radiation, particularly, KrF excimer laser light, electron beam or EUV, and provide a positive resist composition capable of forming a pattern having high resolution typified by mask error enhancement factor (MEEF) characteristics, good pattern profile, sufficient depth of focus, little defects after development, and sufficiently high plasma etching resistance, and a pattern forming method using the composition.

Means for Solving the Problems

The present inventors have made intensive studies, as a result, the object of the present invention has been attained by the following constructions.

<1> A positive resist composition comprising (A) a resin which contains all of the repeating units represented by formulae (I), (II) and (III), and becomes soluble in an alkali developer by the action of an acid, and (B) a compound capable of generating an acid upon irradiation with an actinic ray or radiation:

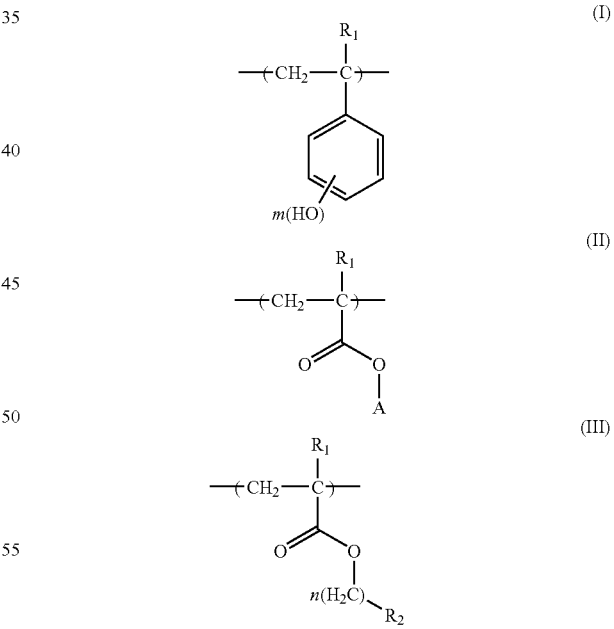

wherein
A represents a group capable of decomposing and leaving by the action of an acid,
each $R_1$ independently represents a hydrogen atom or a methyl group,
$R_2$ represents a phenyl group or a cyclohexyl group,
m represents 1 or 2, and
n represents an integer of 0 to 2.

<2> The positive resin composition as described in <1> above, wherein the repeating unit represented by formula (I) is a structure represented by formula (I)-a:

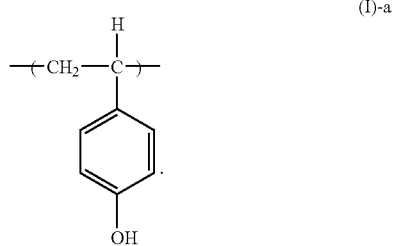

(I)-a

<3> The positive resist composition as described in <1> or <2> above, wherein the repeating unit represented by formula (II) is a structure represented by formula (II)-a:

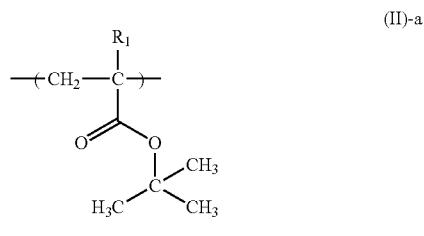

(II)-a wherein $R_1$ represents hydrogen or a methyl group.

<4> The positive resist composition as described in any one of <1> to <3> above, wherein $R_2$ in formula (III) is a phenyl group.

<5> The positive resist composition as described in any one of <1> to <4> above, wherein the mass average molecular weight of the resin as the component (A) is 10,000 or more.

<6> The positive resist composition as described in any one of <1> to <5> above, which further contains (C) an organic basic compound.

<7> The positive resist composition as described in any one of <1> to <6> above, which further contains (D) a surfactant.

<8> The positive resist composition as described in any one of <1> to <7> above, which further contains a solvent.

<9> The positive resist composition as described in <8> above, wherein propylene glycol monomethyl ether acetate is contained as the solvent.

<10> The positive resist composition as described in <9> above, wherein propylene glycol monomethyl ether is further contained as the solvent.

<11> A pattern forming method comprising steps of forming a resist film from the resist composition described in any one of <1> to <10>, and exposing and developing the resist film.

ADVANTAGE OF THE INVENTION

The positive resist composition of the present invention contains a resin having specific repeating units, whereby a pattern having a high resolution typified by mask error enhancement factor (MEEF) characteristics, a good pattern profile, a sufficient depth of focus, little defects after development, and sufficiently high plasma etching resistance can be obtained.

BEST MODE FOR CARRYING OUT THE INVENTION

The compounds for use in the present invention are described in detail below.

Incidentally, in the context of the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

[1] Resin (A)

The resist composition of the present invention contains (A) a resin which contains all of the repeating units represented by formulae (I), (II) and (III), and becomes soluble in an alkali developer by the action of an acid (hereinafter sometimes referred to as a "resin (A)"):

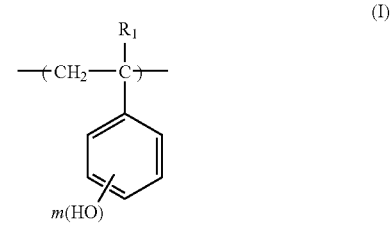

(I)

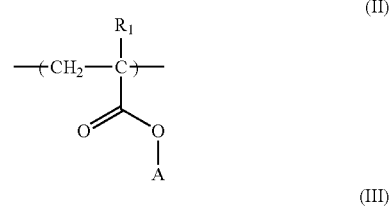

(II)

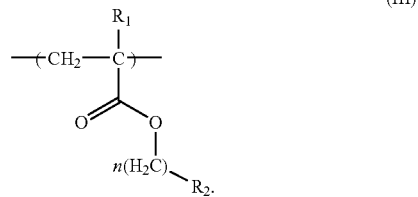

(III)

In formulae (I) to (III), A represents a group capable of decomposing and leaving by the action of an acid, each $R_1$ independently represents a hydrogen atom or a methyl group, $R_2$ represents a phenyl group or a cyclohexyl group, m represents 1 or 2, and n represents an integer of 0 to 2.

The resin (A) for use in the present invention is a resin that is insoluble or sparingly soluble in an alkali developer and becomes soluble in an alkali developer by the action of an acid, and this is a resin having a group capable of decomposing by the action of an acid to produce an alkali-soluble group (hereinafter, sometimes referred to as an "acid-decomposable group"), in either one or both of the main and side chains of the resin.

Examples of the alkali-soluble group include groups having a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis (alkylcarbonyl)imide group, a bis(alkylsulfonyl)methylene group, a bis(alkylsulfonyl)imide group, a tris(alkylcarbonyl) methylene group or a tris(alkylsulfonyl)methylene group.

Preferred alkali-soluble groups are a carboxylic acid group, a fluorinated alcohol group (preferably hexafluoroisopropanol) and a sulfonic acid group.

The group capable of decomposing by the action of an acid (acid-decomposable group) is preferably a group obtained by replacing a hydrogen atom of the above-described alkali-soluble group with a group capable of leaving by the action of an acid.

Examples of the group capable of leaving by the action of an acid include —$C(R_{36})(R_{37})(R_{38})$, —$C(R_{36})(R_{37})(OR_{39})$ and —$C(R_{01})(R_{02})(OR_{39})$.

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The acid-decomposable group is preferably a cumyl ester group, an enol ester group, an acetal ester group, a tertiary alkyl ester group or the like, more preferably a tertiary alkyl ester group. In the present invention, the acid-decomposable group contains the repeating unit represented by formula (II) but may further contain other repeating units.

The compositional ratio of the repeating unit represented by formula (I) in the resin (A) is preferably from 5 to 75 mol %, more preferably from 20 to 70 mol %, based on all repeating units in the resin (A).

Containing the repeating unit represented by formula (I) in the above-described range is preferred from the standpoint of satisfying both the adhesion to substrate and the resolution.

Specific examples of the structure for the repeating unit represented by formula (I) are set forth below, but the present invention is not limited thereto.

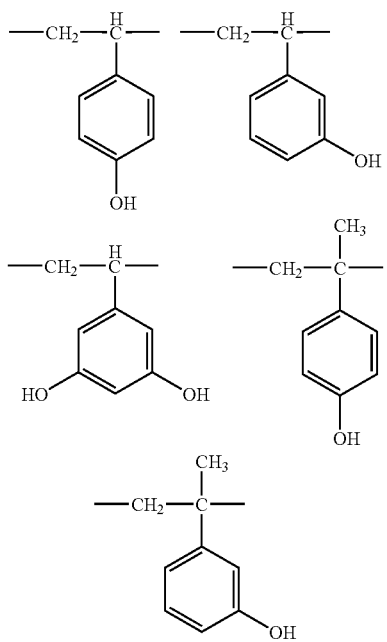

The repeating unit represented by formula (I) is preferably a structure represented by formula (I)-a:

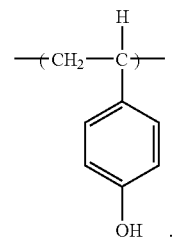

(I)-a

In the repeating unit represented by formula (II), A represents a group capable of decomposing and leaving by the action of an acid and is preferably a hydrocarbon group (preferably having a carbon number of 20 or less, more preferably from 4 to 12), more preferably a tert-butyl group, a tert-amyl group or an alicyclic structure-containing hydrocarbon group (for example, an alicyclic group itself or a group where an alicyclic group is substituted on an alkyl group), still more preferably a tert-butyl group. The alicyclic structure may be monocyclic or polycyclic. Specific examples thereof include a monocyclo, bicyclo, tricyclo or tetracyclo structure having a carbon number of 5 or more. The carbon number thereof is preferably from 6 to 30, more preferably from 7 to 25. The hydrocarbon group having such an alicyclic structure may further have a substituent. Examples of the substituent which the hydrocarbon group may further have include an alkyl group having a carbon number of 1 to 4, an alkoxyl group, an alkoxycarbonyl group, a carbamoyl group, a cyano group and a nitro group.

The compositional ratio of the repeating unit represented by formula (II) in the resin (A) is preferably from 5 to 50 mol %, more preferably from 10 to 40 mol %, based on all repeating units in the resin (A).

Setting the content of the repeating unit represented by formula (II) to the above-described range is preferred from the standpoint of satisfying both the dissolution rate for an alkali developer and the plasma etching resistance.

Specific examples of the structure for the repeating unit represented by formula (II) are set forth below, but the present invention is not limited thereto.

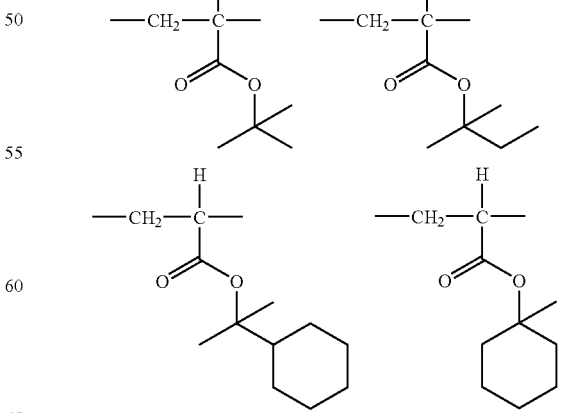

-continued

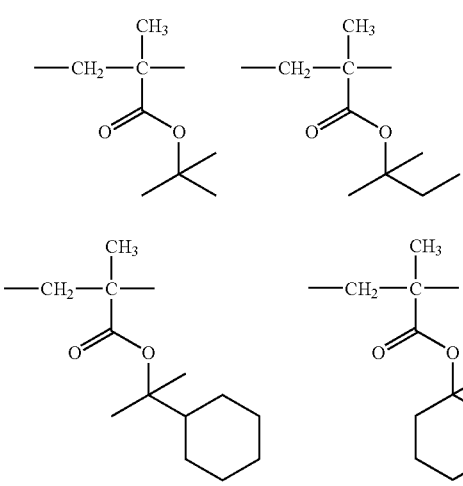

The repeating unit represented by formula (II) is preferably a structure represented by formula (II)-a:

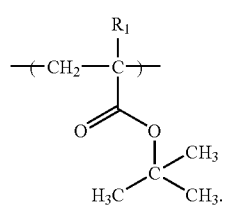

(II)-a

In formula (II)-a, $R_1$ represents a hydrogen atom or a methyl group.

In the repeating unit represented by formula (III), $R_2$ represents a phenyl group or a cyclohexyl group, and these phenyl and cyclohexyl groups may further have one or more substituents. In view of plasma etching resistance, $R_2$ is preferably a phenyl group.

Examples of the substituent which the phenyl group and cyclohexyl group may have include an alkyl group having a carbon number of 1 to 4, an alkoxyl group, an alkoxycarbonyl group, a carbamoyl group, a cyano group and a nitro group. Above all, the substituent is preferably an alkyl group having a carbon number of 1 to 4.

n is preferably 1.

The compositional ratio of the repeating unit represented by formula (III) in the resin (A) is preferably from 1 to 50 mol %, more preferably from 5 to 40 mol %, still more preferably from 10 to 35 mol %, based on the resin (A). Containing the repeating unit represented by formula (III) in the above-described range is preferred from the standpoint of satisfying both sufficient plasma etching resistance and sufficient solubility of the exposed area, despite obtaining a rectangular shaped pattern due to the dissolution inhibiting effect.

Specific examples of the structure for the repeating unit represented by formula (III) are set forth below, but the present invention is not limited thereto.

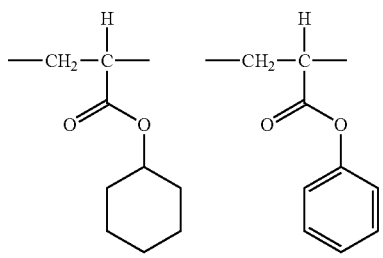
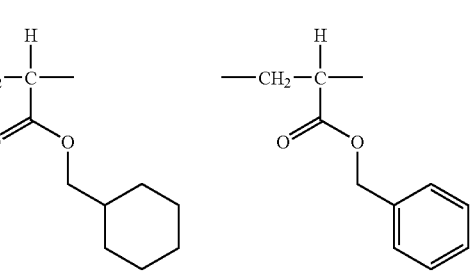

-continued

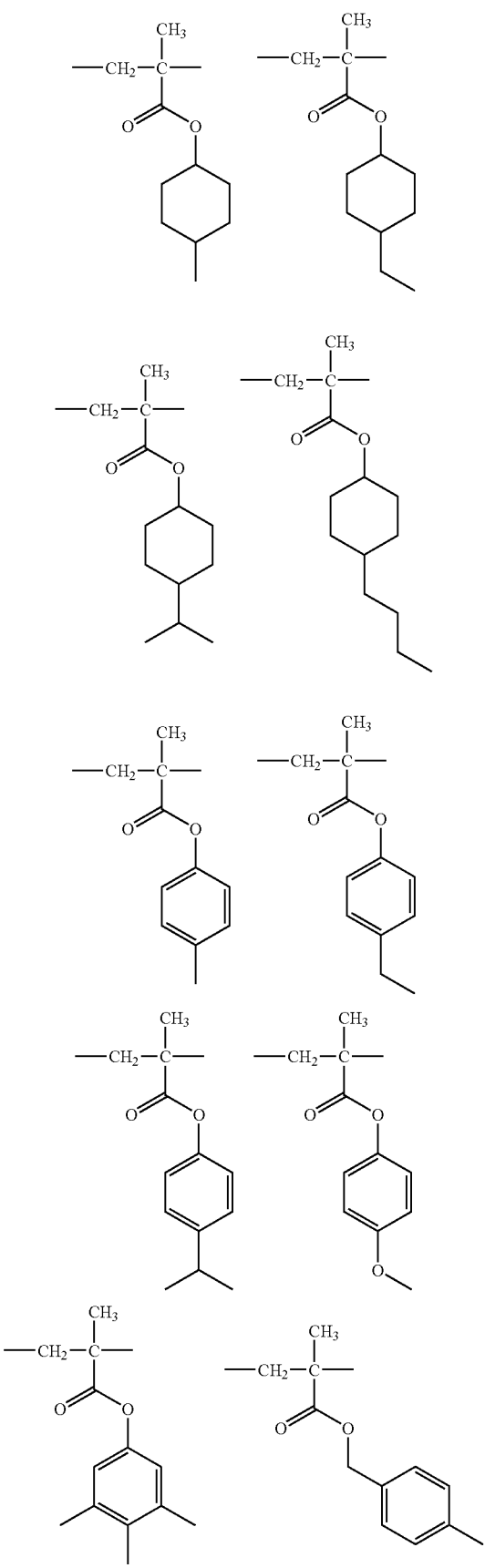

-continued

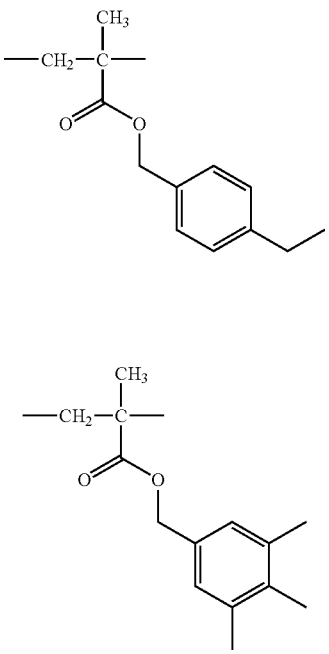

The mass average molecular weight (Mw) of the resin (A) is preferably 10,000 or more. Thanks to the high molecular weight, the alkali dissolution rate of the unexposed area can be made low. In turn, the protection ratio can be reduced, and various performances such as etching resistance and DOF margin of isolated line can be enhanced.

Also, in view of dissolution rate of the resin itself for an alkali, sensitivity and defect generation, the mass average molecular weight (Mw) is preferably 200,000.

The polydispersity (Mw/Mn) is preferably from 1.0 to 3.0, more preferably from 1.0 to 2.5, still more preferably from 1.0 to 2.0.

Above all, the mass average molecular weight (Mw) of the resin is preferably from 10,000 to 200,000, more preferably from 10,000 to 100,000, still more preferably from 10,000 to 50,000, and most preferably from 10,000 to 25,000.

The mass average molecular weight here is defined as a polystyrene-reduced value determined by gel permeation chromatography.

As for the resin (A), a resin (A) having a polydispersity of 1.5 to 2.0 can be synthesized by performing radical polymerization using a radical polymerization initiator. A resin (A) having a more preferred polydispersity of 1.0 to 1.5 can be synthesized by living radical polymerization.

In the polymerization, usually, polymerization is performed after protecting a hydroxyl group of a monomer corresponding to the repeating unit of formula (I) with an acetyl group or the like, and then deprotection is performed to obtain a desired resin.

Specific examples of the resin (A) are set forth below, but the present invention is not limited thereto.

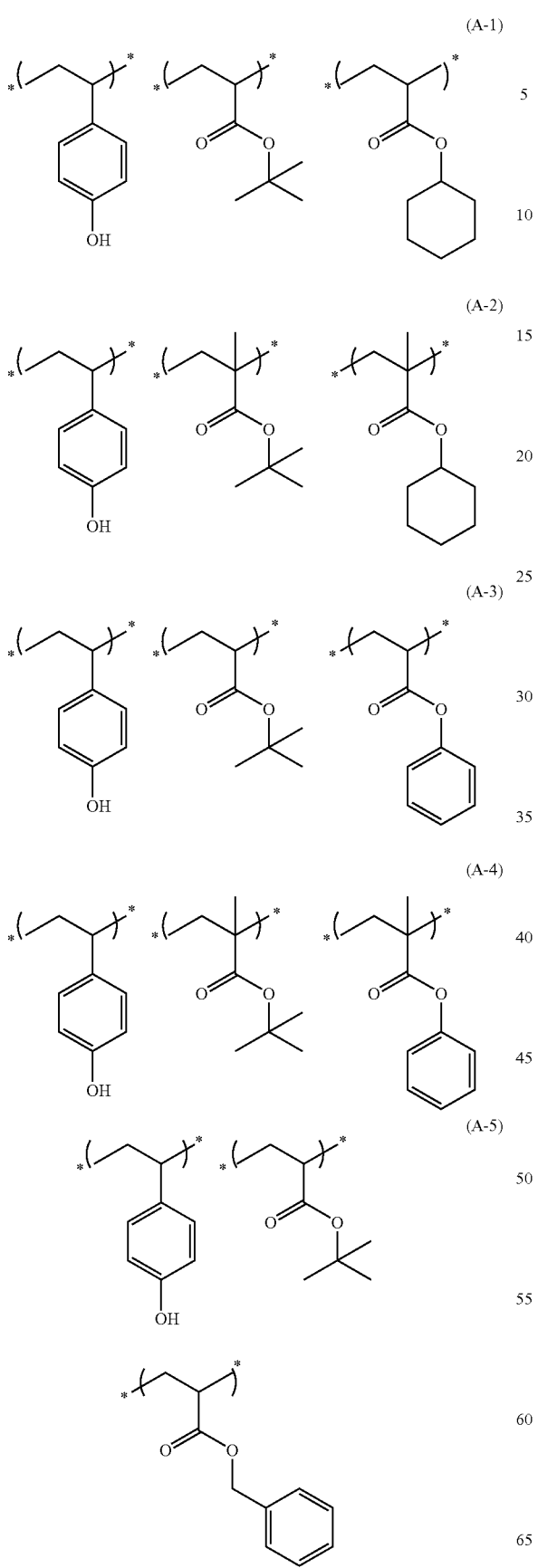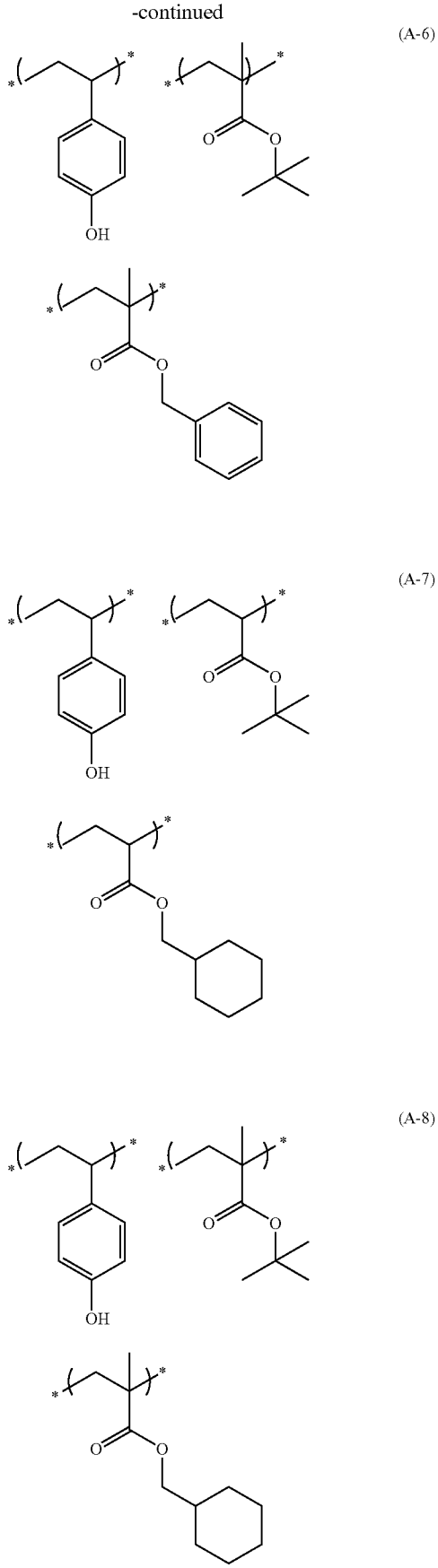

(A-9) 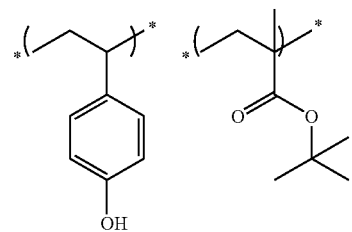
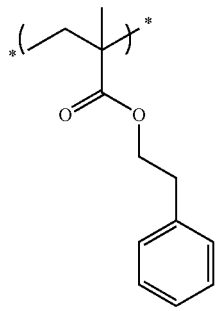
(A-10) 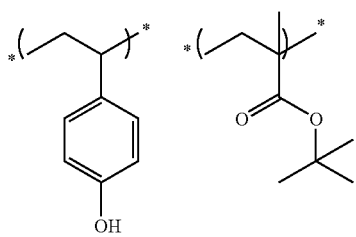
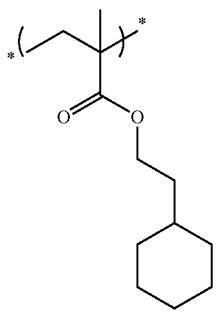
(A-11) 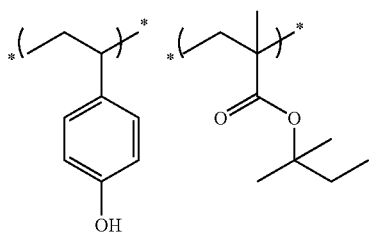 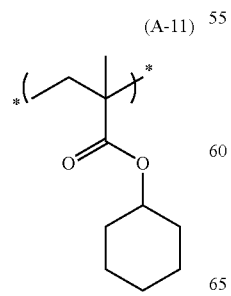
(A-12) 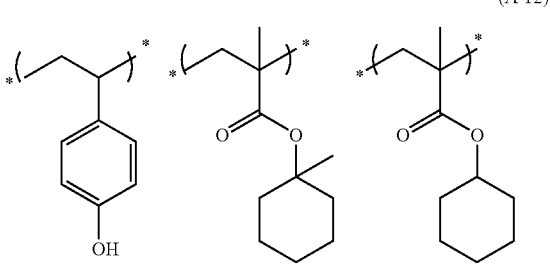
(A-13)
(A-14)
(A-15) 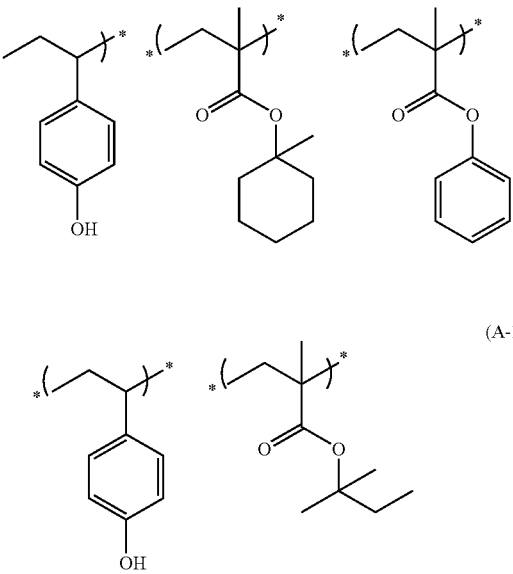
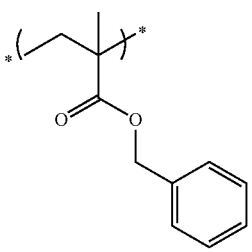

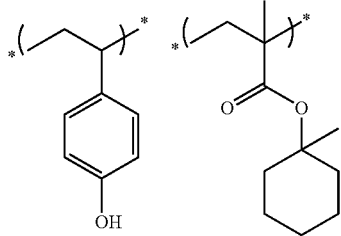
(A-16)

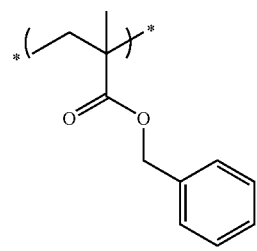

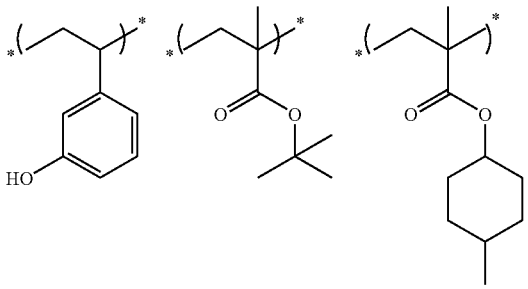
(A-17)

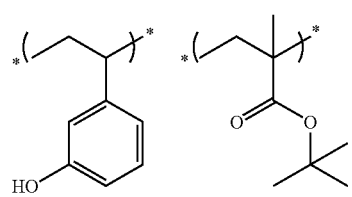
(A-18)

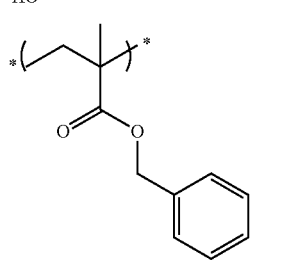

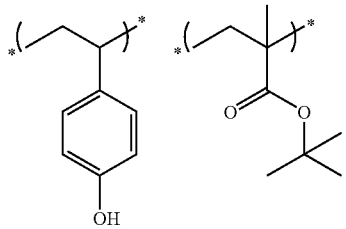
(A-19)

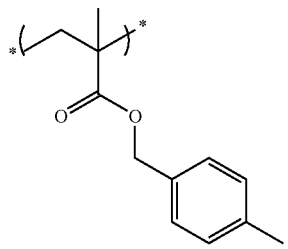

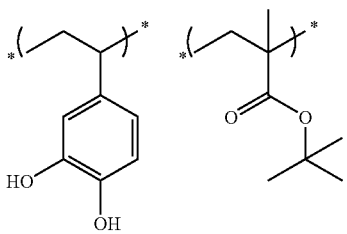
(A-20)

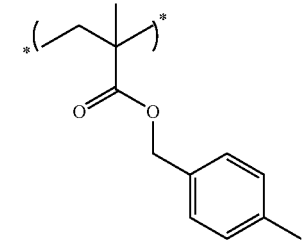

[2] Acid Generator (B)

The resist composition of the present invention contains (B) a compound capable of generating an acid upon irradiation with an actinic ray or radiation (hereinafter sometimes referred to as an "acid generator (B)"). The acid generator which can be used may be appropriately selected from a photo-initiator for cationic photopolymerization, a photo-initiator for radical photopolymerization, a photo-decoloring agent for dyes, a photo-discoloring agent, a compound known to generate an acid upon irradiation with an actinic ray or radiation and used for microresist or the like, and a mixture thereof.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, a compound where such a group or compound capable of generating an acid upon irradiation with an actinic ray or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the compounds capable of generating an acid upon irradiation with an actinic ray or radiation as the acid generator (B), preferred are compounds represented by the following formulae (ZI), (ZII) and (ZIII):

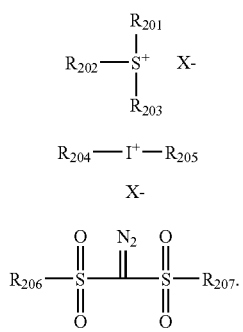

In formula (ZI), each of $R_{201}$, $R_{202}$ and $R_{203}$ independently represents an organic group.

$X^-$ represents a non-nucleophilic anion, and preferred examples thereof include sulfonate anion, bis(alkylsulfonyl) amide anion, tris(alkylsulfonyl)methide anion, $BF_4^-$, $PF_6^-$ and $SbF_6^-$. The anion is preferably an organic anion containing a carbon atom. The preferred organic anion includes organic anions represented by the following formulae AN1 to AN3:

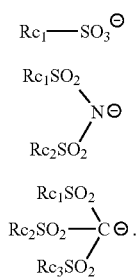

In formulae AN1 to AN3, each of $Rc_1$ to $Rc_3$ independently represents an organic group. The organic group of $Rc_1$ to $Rc_3$ includes an organic group having a carbon number of 1 to 30 and is preferably an alkyl or aryl group which may be substituted, or a group where a plurality of these groups are connected through a single bond or a linking group such as —O—, —CO$_2$—, —S—, —SO$_3$— and —SO$_2$N(Rd$_1$)-. Furthermore, the organic group may form a ring structure with another alkyl or aryl group bonded thereto.

$Rd_1$ represents a hydrogen atom or an alkyl group and may form a ring structure with the alkyl or aryl group to which $Rd_1$ is bonded.

The organic group of $Rc_1$ to $Rc_3$ may also be an alkyl group substituted by a fluorine atom or a fluoroalkyl group at the 1-position, or a phenyl group substituted by a fluorine atom or a fluoroalkyl group. By virtue of having a fluorine atom or a fluoroalkyl group, the acidity of the acid generated upon irradiation with light increases and the sensitivity rises. When each of $Rc_1$ to $Rc_3$ has 5 or more carbon atoms, at least one carbon atom is preferably substituted by a hydrogen atom, and it is more preferred that the number of hydrogen atoms is larger than the number of fluorine atoms. The absence of a perfluoroalkyl group having a carbon number of 5 or more enables reduction in the toxicity to ecology.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group.

Examples of the group formed by combining two members out of $R_{201}$ to $R_{203}$ include an alkylene group (e.g., butylene, pentylene).

Specific examples of the organic group as $R_{201}$, $R_{202}$ and $R_{203}$ include corresponding groups in the compounds (ZI-1), (ZI-2) and (ZI-3) described later.

The compound may be a compound having a plurality of structures represented by formula (ZI). For example, the compound may be a compound having a structure where at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group.

Examples of the arylsulfonium compound include a triarylsulfonium compound, a diarylalkylsulfonium compound and an aryldialkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same or different.

The alkyl group which is present, if desired, in the arylsulfonium compound is preferably a linear, branched or cyclic alkyl group having a carbon number of 1 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group and alkyl group as $R_{201}$ to $R_{203}$ may have, as the substituent, an alkyl group (for example, having a carbon number of 1 to 15), an aryl group (for example, having a carbon number of 6 to 14), an alkoxy group (for example, having a carbon number of 1 to 15), a halogen atom, a hydroxyl group or a phenylthio group. The substituent is preferably a linear, branched or cyclic alkyl group having a carbon number of 1 to 12, or a linear, branched or cyclic alkoxy group having a carbon number of 1 to 12, and most preferably an alkyl group having a carbon number of 1 to 4 or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted at the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ is independently preferably an alkyl group, a 2-oxoalkyl group, an alkoxycarbonylmethyl group, an allyl group or a vinyl group, more preferably a linear, branched or cyclic 2-oxoalkyl group or an alkoxycarbonylmethyl group, and most preferably a linear or branched 2-oxoalkyl group.

The alkyl group as $R_{201}$ to $R_{203}$ may be linear, branched or cyclic and is preferably a linear or branched alkyl group having a carbon number of 1 to 10 (e.g., methyl, ethyl, propyl, butyl, pentyl), or a cyclic alkyl group having a carbon number of 3 to 10 (e.g., cyclopentyl, cyclohexyl, norbornyl).

The 2-oxoalkyl group as $R_{201}$ to $R_{203}$ may be linear, branched or cyclic and is preferably a group having >C=O at the 2-position of the above-described alkyl group.

The alkoxy group in the alkoxycarbonylmethyl group as $R_{201}$ to $R_{203}$ is preferably an alkoxy group having a carbon number of 1 to 5 (e.g., methoxy, ethoxy, propoxy, butoxy, pentoxy).

Each of $R_{201}$ to $R_{203}$ may be further substituted by a halogen atom, an alkoxy group (for example, having a carbon number of 1 to 5), a hydroxyl group, a cyano group or a nitro group.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

The compound (ZI-3) is described below.

The compound (ZI-3) is a compound represented by the following formula (ZI-3), and this is a compound having a phenacylsulfonium salt structure.

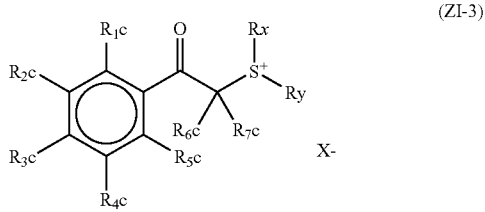

(ZI-3)

Each of $R_{1c}$ to $R_{5c}$ independently represents a hydrogen atom, an alkyl group, an alkoxy group or a halogen atom.

Each of $R_{6c}$ and $R_{7c}$ represents a hydrogen atom or an alkyl group.

Each of $R_x$ and $R_y$ independently represents an alkyl group, a 2-oxoalkyl group, an alkoxycarbonylmethyl group, an allyl group or a vinyl group.

Any two or more members out of $R_{1c}$ to $R_{7c}$ may combine to form a ring structure. Also, $R_x$ and $R_y$ may combine to form a ring structure. This ring structure may contain an oxygen atom, a sulfur atom, an ester bond or an amido bond.

X⁻ has the same meaning as X⁻ in formula (ZI).

The alkyl group as $R_{1c}$ to $R_{7c}$ may be linear, branched or cyclic and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl) or a cyclic alkyl group having a carbon number of 3 to 8 (e.g., cyclopentyl, cyclohexyl).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear, branched or cyclic alkyl group or a linear, branched or cyclic alkoxy group is preferred, and a compound where the sum of carbon numbers of $R_{1c}$ to $R_{5c}$ is from 2 to 15 is more preferred. Thanks to this construction, the solvent solubility is more enhanced and generation of particles during storage is suppressed. Each of $R_{6c}$ and $R_{7c}$ is preferably a hydrogen atom or an alkyl group having a carbon number of 1 to 6.

Examples of the alkyl group as $R_x$ and $R_y$ are the same as those of the alkyl group of $R_{1c}$ to $R_{7c}$.

Examples of the 2-oxoalkyl group include a group having >C=O at the 2-position of the alkyl group described for $R_{1c}$ to $R_{7c}$.

Examples of the alkoxy group in the alkoxycarbonylalkyl group are the same as those of the alkoxy group as $R_{1c}$ to $R_{5c}$.

Examples of the group formed by combining $R_x$ and $R_y$ include a butylene group and a pentylene group.

Each of $R_x$ and $R_y$ is preferably an alkyl group having a carbon number of 4 or more, more preferably 6 or more, still more preferably 8 or more.

Formulae (ZII) and (ZIII) are described below.

In formulae (ZII) and (ZIII), each of $R_{204}$ to $R_{207}$ independently represents an aryl group which may have a substituent, an alkyl group which may have a substituent, or a cycloalkyl group which may have a substituent.

The aryl group of $R_{204}$ to $R_{207}$ is preferably a phenyl group or a naphthyl group, more preferably a phenyl group.

The alkyl group as $R_{204}$ to $R_{207}$ may be linear or branched and is preferably a linear or branched alkyl group having a carbon number of 1 to 10 (e.g., methyl, ethyl, propyl, butyl, pentyl).

The cycloalkyl group as $R_{204}$ to $R_{207}$ is preferably a cycloalkyl group having a carbon number of 3 to 10 (e.g., cyclopentyl, cyclohexyl, norbornyl).

Examples of the substituent which each of $R_{204}$ to $R_{207}$ may have include an alkyl group (for example, having a carbon number of 1 to 15), an aryl group (for example, having a carbon number of 6 to 15), an alkoxy group (for example, having a carbon number of 1 to 15), a halogen atom (e.g., fluorine, chlorine), a hydroxyl group and a phenylthio group.

X⁻ has the same meaning as the non-nucleophilic anion of X⁻ in formula (ZI).

Out of the compounds capable of generating an acid upon irradiation with an actinic ray or radiation as the acid generator (B), preferred compounds further include compounds represented by the following formulae (ZIV), (ZV) and (ZVI):

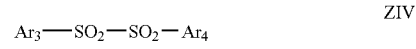

ZIV

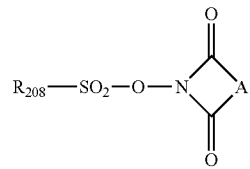

ZV

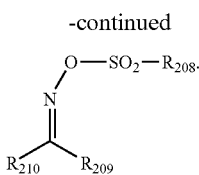

In formulae (ZIV) to (ZVI), each of $Ar_3$ and $Ar_4$ independently represents a substituted or unsubstituted aryl group.

Each $R_{208}$ independently between formulae (ZV) and (ZVI) represents a substituted or unsubstituted alkyl group, a substituted or unsubstituted cycloalkyl group or a substituted or unsubstituted aryl group. In view of increasing the strength of the acid generated, $R_{208}$ is preferably substituted by a fluorine atom.

Each of $R_{209}$ and $R_{210}$ independently represents a substituted or unsubstituted alkyl group, a substituted or unsubstituted cycloalkyl group, a substituted or unsubstituted aryl group or an electron-withdrawing group. $R_{209}$ is preferably a substituted or unsubstituted aryl group, and $R_{210}$ is preferably an electron-withdrawing group, more preferably a cyano group or a fluoroalkyl group.

A represents a substituted or unsubstituted alkylene group, a substituted or unsubstituted alkenylene group or a substituted or unsubstituted arylene group.

In the present invention, a compound having a plurality of structures represented by formula (ZVI) is also preferred. For example, the compound may be a compound having a structure where either $R_{209}$ or $R_{210}$ in the compound represented by formula (ZVI) is bonded to either $R_{209}$ or $R_{210}$ in another compound represented by formula (ZVI).

Among the compounds capable of generating an acid upon irradiation with an actinic ray or radiation as the acid generator (B), the compounds represented by formulae (ZI) to (ZIII) are preferred, the compound represented by formula (ZI) is more preferred, and the compounds represented by (ZI-1) to (ZI-3) are most preferred.

Furthermore, a compound capable of generating an acid represented by the following formulae AC1 to AC3 upon irradiation with an actinic ray or radiation is preferred.

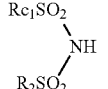

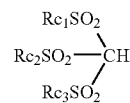

That is, a most preferred embodiment of the component (B) is a compound where in the structure of formula (ZI), $X^-$ is an anion selected from AN1, AN2 and AN3. $Rc_1$ to $Rc_3$ have the same meanings as $Rc_1$ to $Rc_3$, respectively, in formulae AN1, AN2 and AN3.

Specific examples of the acid generator (B) are set forth below, but the present invention is not limited thereto.

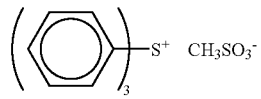
(B1)

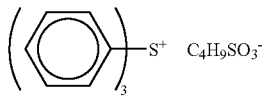
(B2)

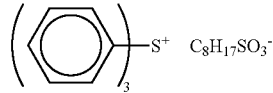
(B3)

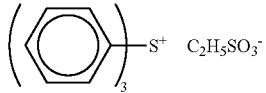
(B4)

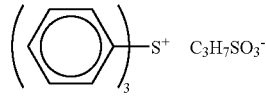
(B5)

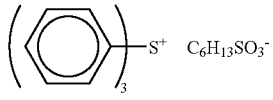
(B6)

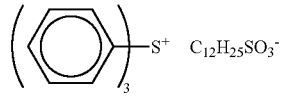
(B7)

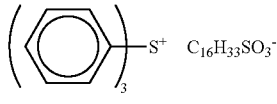
(B8)

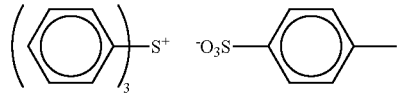
(B9)

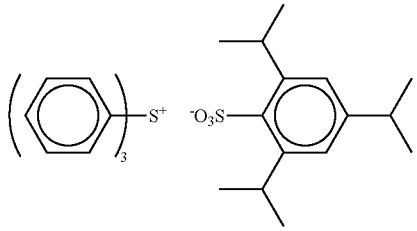
(B10)

-continued
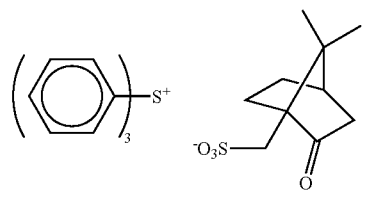
(B11)
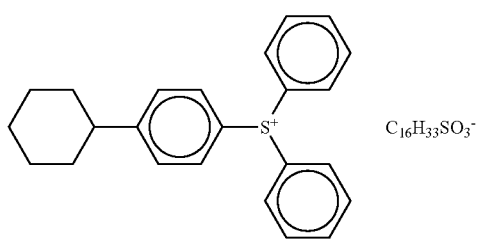
(B12)
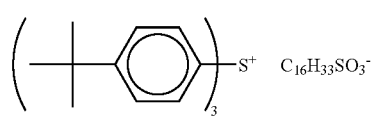
(B13)
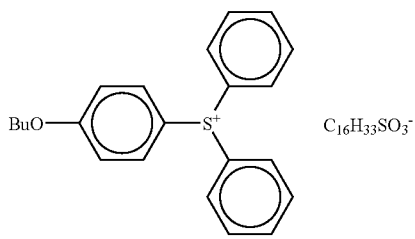
(B14)
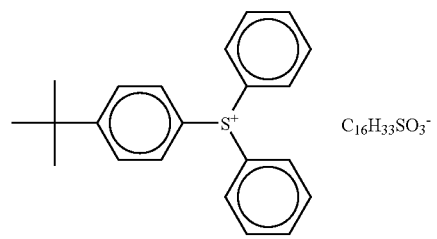
(B15)
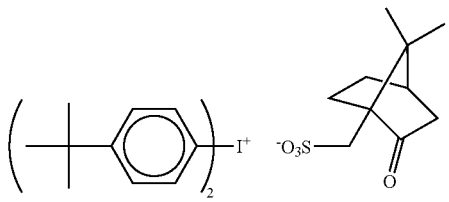
(B16)
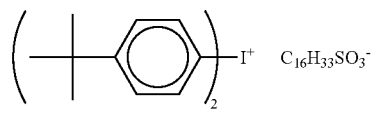
(B17)
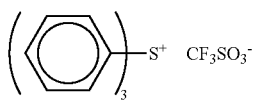
(B18)
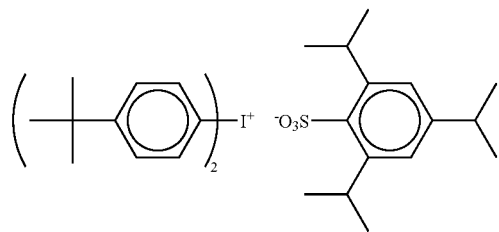
(B19)
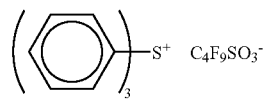
(B20)
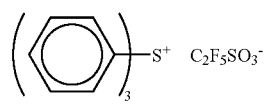
(B21)
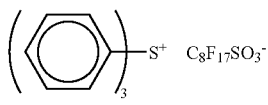
(B22)
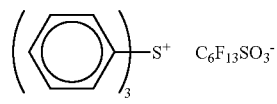
(B23)
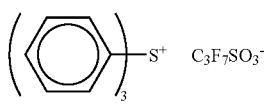
(B24)
(B25)
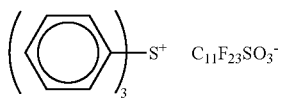
(B26)

-continued
(B27) 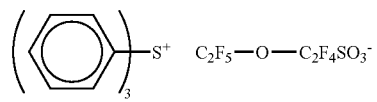
(B28) 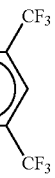
(B29) 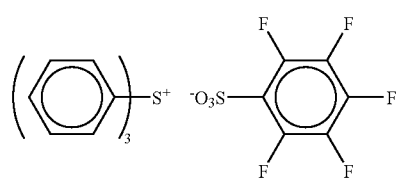
(B30) 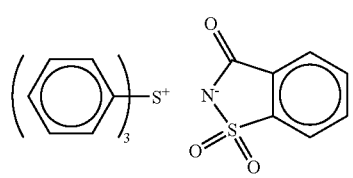
(B31) 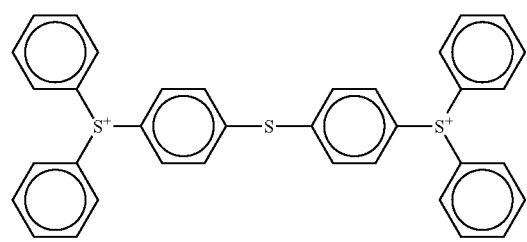
(B32) 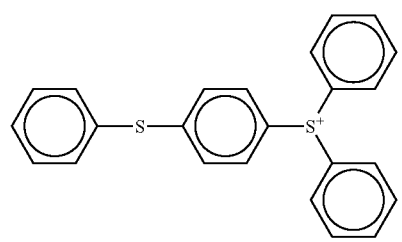
(B33) 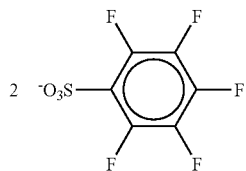
(B34) 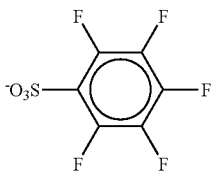
(B35) 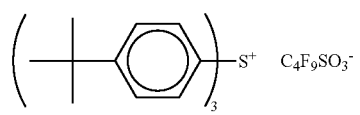
(B36) 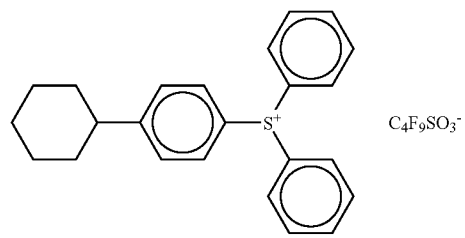
(B37) 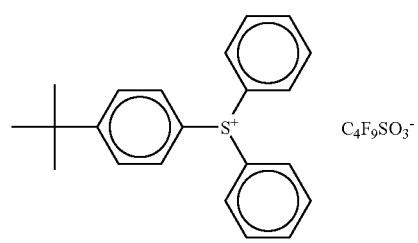
(B38) 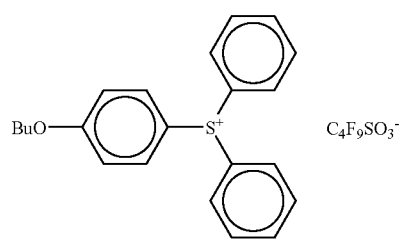

-continued
(B39)
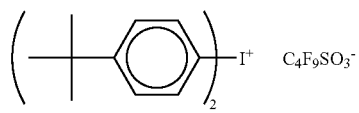
(B40)
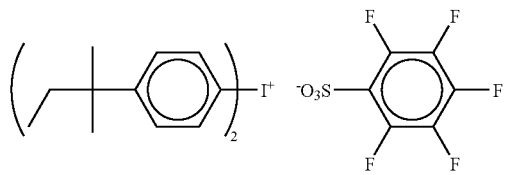
(B41)
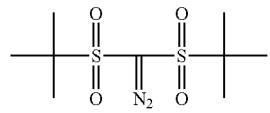
(B42)
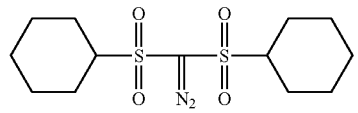
(B43)
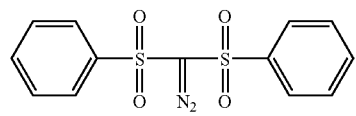
(B44)
(structure)
(B45)
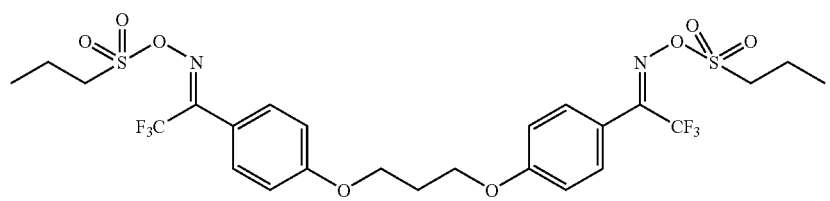
(B46)
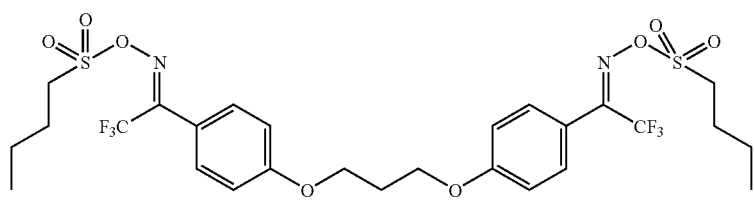
(B47)
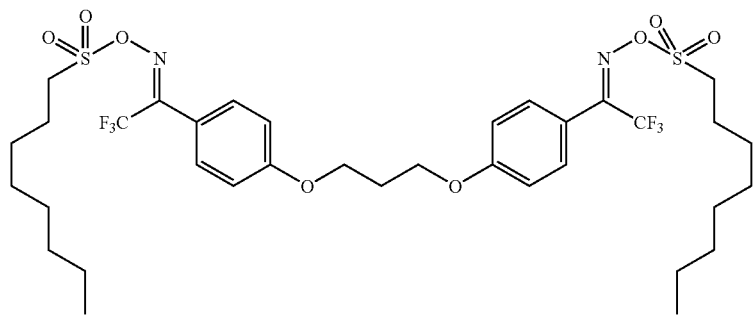
(B48)
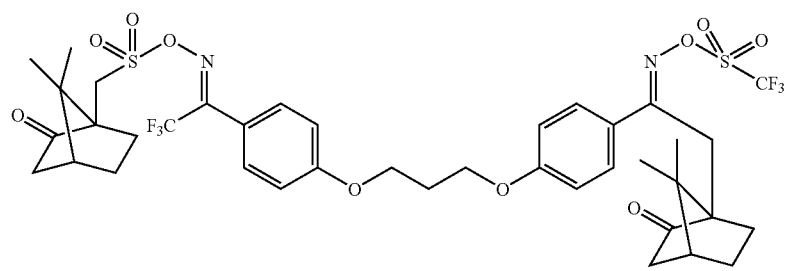
(B49)
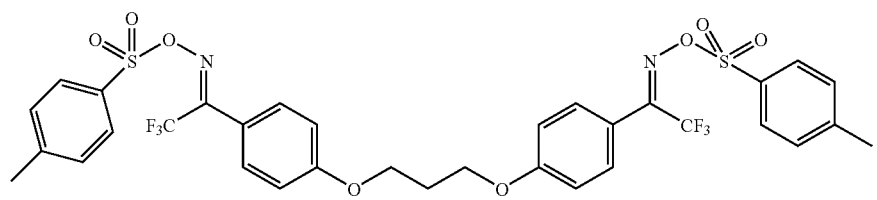

-continued
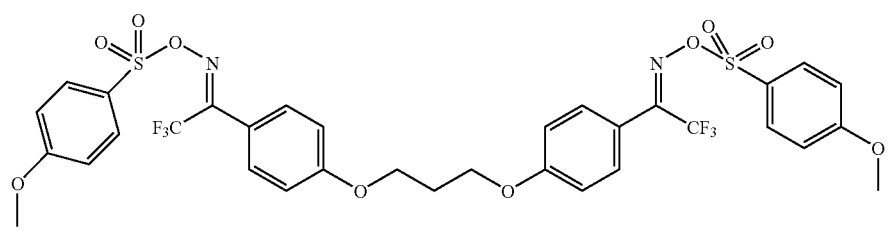
(B50)
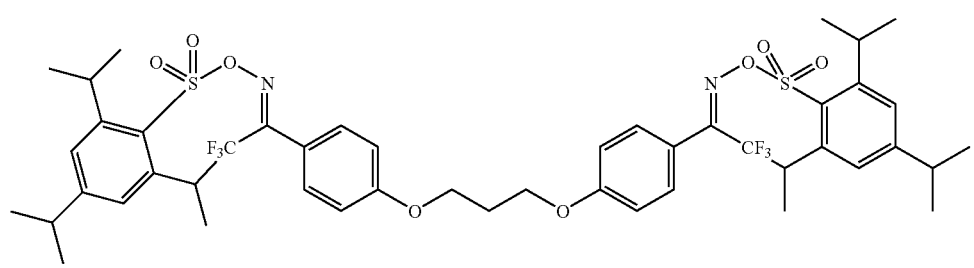
(B51)
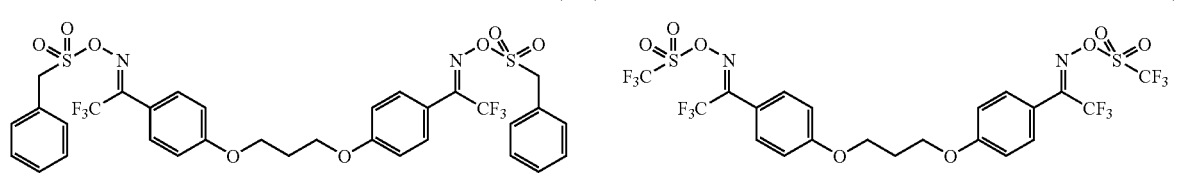
(B52) (B53)
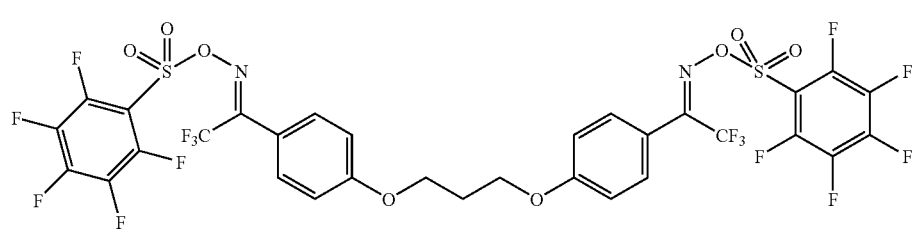
(B54)
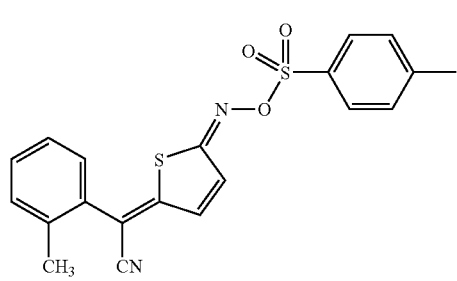
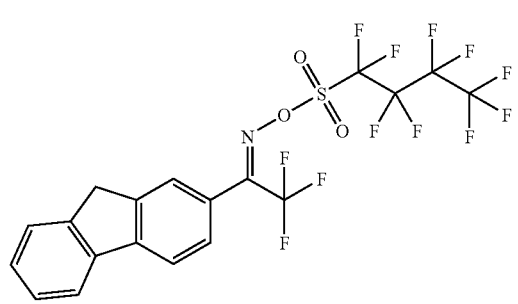
(B55) (B56)
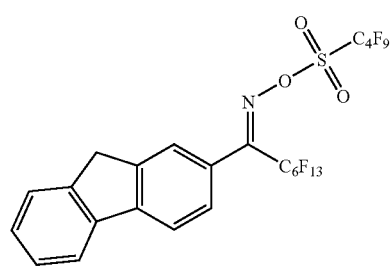
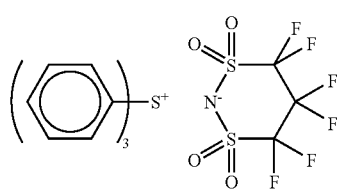
(B57) (B63)

-continued (B64)
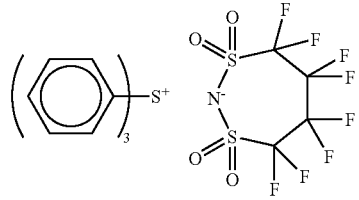

(B65)
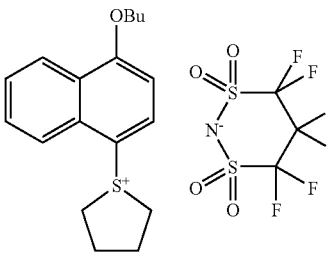

(B66)
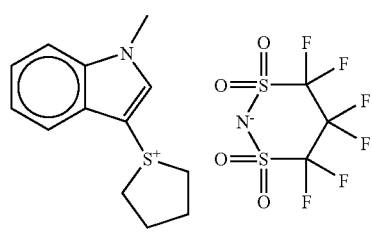

(B67)
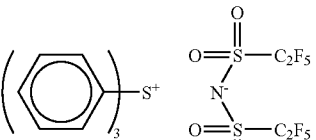

(B68)
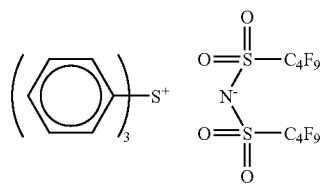

(B69)
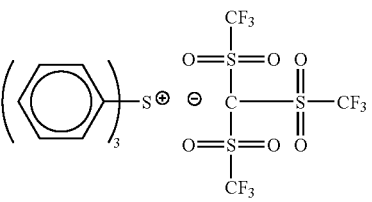

(B70)
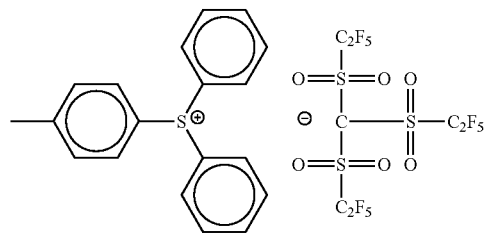

(B71)
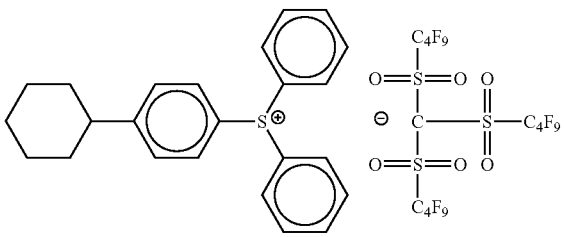

As for the acid generator (B), one kind may be used alone, or two or more kinds may be used in combination. In the case of using two or more kinds of acid generators in combination, compounds capable of generating two kinds of organic acids differing in the total number of atoms excluding hydrogen atom by 2 or more are preferably combined.

The content of the acid generator (B) in the composition is preferably from 0.1 to 20 mass %, more preferably from 0.5 to 10 mass %, still more preferably from 1 to 7 mass %, based on the entire solid content of the resist composition.

[3] Organic Basic Compound (C)

The resist composition of the present invention preferably contains an organic basic compound. The organic basic compound is preferably a compound having basicity stronger than that of phenol. The molecular weight of the organic basic compound is usually from 100 to 900, preferably from 150 to 800, more preferably from 200 to 700. In particular, a nitrogen-containing basic compound is preferred.

Preferred nitrogen-containing basic compounds are, in terms of preferred chemical environment, compounds having a structure of the following formulae (CI) to (CV). The structure of formulae (CII) to (CV) may be a part of a ring structure.

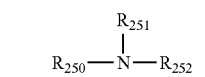 (CI)

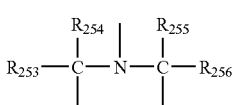 (CII)

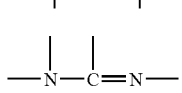 (CIII)

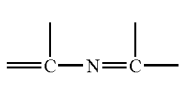 (CIV)

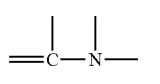 (CV)

In the formulae above, each of $R_{250}$, $R_{251}$ and $R_{252}$, which may be the same or different, represents a hydrogen atom, an alkyl group (preferably having a carbon number of 1 to 20), a cycloalkyl group (preferably having a carbon number of 3 to 20), or an aryl group (preferably having a carbon number of 6 to 20), and $R_{251}$ and $R_{252}$ may combine together to form a ring.

The alkyl group above may be unsubstituted or may have a substituent, and the alkyl group having a substituent is preferably an aminoalkyl group having a carbon number of 1 to 6 or a hydroxyalkyl group having a carbon number of 1 to 6.

Each of $R_{253}$, $R_{254}$, $R_{255}$ and $R_{256}$, which may be the same or different, represents an alkyl group having a carbon number of 1 to 6.

The compound is more preferably a nitrogen-containing basic compound having two or more nitrogen atoms differing in the chemical environment within one molecule, more preferably a compound having both a substituted or unsubstituted amino group and a nitrogen atom-containing ring structure, or a compound having an alkylamino group.

Other examples include at least one kind of a nitrogen-containing compound selected from an amine compound having a phenoxy group, an ammonium salt compound having a phenoxy group, an amine compound having a sulfonic acid ester group, and an ammonium salt compound having a sulfonic acid ester group.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group ($—CH_2CH_2O—$) and an oxypropylene group ($—CH(CH_3)CH_2O—$ or $—CH_2CH_2CH_2O—$) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group ($—CH_2CH_2O—$) and an oxypropylene group ($—CH(CH_3)CH_2O—$ or $—CH_2CH_2CH_2O—$) are preferred, and an oxyethylene group is more preferred. Examples of the anion of the ammonium salt compound include a halogen atom, a sulfonate, a borate and a phosphate, with a halogen atom and a sulfonate being preferred. The halogen atom is preferably chloride, bromide or iodide, and the sulfonate is preferably an organic sulfonate having a carbon number of 1 to 20. Examples of the organic sulfonate include an alkylsulfonate having a carbon number of 1 to 20 and an arylsulfonate. The alkyl group of the alkylsulfonate may have a substituent, and examples of the substituent include fluorine, chlorine, bromine, an alkoxy group, an acyl group and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate. Examples of the aryl group of the arylsulfonate include a benzene ring, a naphthalene ring and an anthracene ring. The benzene ring, naphthalene ring and anthracene ring may have a substituent, and the substituent is preferably a linear or branched alkyl group having a carbon number of 1 to 6, or a cycloalkyl group having a carbon number of 3 to 6. Specific examples of the linear or branched alkyl group and cycloalkyl group include methyl, ethyl, n-propyl, isopropyl, n-butyl, i-butyl, tert-butyl, n-hexyl and cyclohexyl. Other examples of the substituent include an alkoxy group having a carbon number of 1 to 6, a halogen atom, cyano, nitro, an acyl group and an acyloxy group.

The amine compound having a phenoxy group and the ammonium salt compound having a phenoxy group are an amine compound or ammonium salt compound having a phenoxy group at the terminal opposite the nitrogen atom of the alkyl group. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution site of the substituent may be any of 2- to 6-positions, and the number of substituents may be any in the range from 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6. Among oxyalkylene groups, an oxyethylene group ($—CH_2CH_2O—$) and an oxypropylene group ($—CH(CH_3)CH_2O—$ or $—CH_2CH_2CH_2O—$) are preferred, and an oxyethylene group is more preferred.

The amine compound having a phenoxy group can be obtained by reacting a phenoxy group-containing primary or secondary amine with a haloalkyl ether under heating, adding an aqueous solution of a strong base such as sodium hydroxide, potassium hydroxide and tetraalkylammonium, and extracting the compound with an organic solvent such as ethyl acetate and chloroform. Alternatively, the compound may be obtained by reacting a primary or secondary amine with a haloalkyl ether having a phenoxy group at the terminal under heating, adding an aqueous solution of a strong base such as sodium hydroxide, potassium hydroxide and tetraalkylammonium, and extracting the compound with an organic solvent such as ethyl acetate and chloroform.

The sulfonic acid ester group in the amine compound having a sulfonic acid ester group and the ammonium salt compound having a sulfonic acid ester group may be any of an alkylsulfonic acid ester, a cycloalkylsulfonic acid ester and an arylsulfonic acid ester. In the case of an alkylsulfonic acid ester, the alkyl group preferably has a carbon number of 1 to 20; in the case of a cycloalkylsulfonic acid ester, the cycloalkyl group preferably has a carbon number of 3 to 20; and in the case of an arylsulfonic acid ester, the aryl group preferably has a carbon number of 6 to 12. The alkylsulfonic acid ester, cycloalkylsulfonic acid ester and arylsulfonic acid ester may have a substituent, and the substituent is preferably a halogen atom, a cyano group, a nitro group, a carboxyl group, a carboxylic acid ester group or a sulfonic acid ester group.

The compound preferably has at least one oxyalkylene group between the sulfonic acid ester group and the nitrogen atom. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

Preferred examples of the organic basic compound include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine and aminoalkylmorpholine. These compounds may have a substituent, and preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Particularly preferred examples of the organic basic compound include, but are not limited to, guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine and 1,8-diazabicyclo[5.4.0]-7-undecene.

A tetraalkylammonium salt-type nitrogen-containing basic compound can also be used.

Above all, a tetraalkylammonium hydroxide having a carbon number of 1 to 8 (e.g., tetramethylammonium hydroxide, tetraethylammonium hydroxide, tetra-(n-butyl)ammonium hydroxide) is preferred. One of these nitrogen-containing basic compounds is used alone, or two or more thereof are used in combination.

As for the ratio between the amount of the acid generator used and the amount of the organic basic compound used in the composition, the organic basic compound/acid generator (by mol) is preferably from 0.01 to 10. That is, the molar ratio is preferably 10 or less in view of sensitivity and resolution and is preferably 0.01 or more from the standpoint of suppressing reduction in the resolution due to thickening of the resist pattern with aging after exposure until heat treatment. The organic basic compound/acid generator (by mol) is more preferably from 0.05 to 5, still more preferably from 0.1 to 3.

[4] Surfactant (D)

In the present invention, surfactants may be used, and use of surfactants is preferred in view of film formability, adherence of pattern, reduction of development defect, and the like.

Specific examples of the surfactant include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene.polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); a fluorine-containing or silicon-containing surfactant such as EFtop EF301, EF303 and EF352 (produced by Shin-Akita Kasei K.K.), Megaface F171 and F173 (produced by Dainippon Ink & Chemicals, Inc.), Florad FC430 and FC431 (produced by Sumitomo 3M Inc.), Asahi Guard AG710, Surflon S-382, SC101, SC102, SC103, SC104, SC105 and SC106 (produced by Asahi Glass Co., Ltd.) and Troysol S-366 (produced by Troy Chemical); an organosiloxane polymer KP-341 (produced by Shin-Etsu Chemical Co., Ltd.); and an acrylic or methacrylic acid-based (co)polymer Polyflow No. 75, and No. 95 (produced by Kyoeisha Chemical Co., Ltd.). The blending amount of the surfactant is usually 2 parts by mass or less, preferably from 1 part by mass or less, per 100 parts by mass of the solid content in the composition of the present invention.

One of these surfactants may be used alone, or some surfactants may be used in combination.

As for the surfactant, it is preferred to contain any of fluorine-containing and/or silicon-containing surfactants (a fluorine-containing surfactant, a silicon-containing surfactant and a surfactant containing both a fluorine atom and a silicon atom), or two or more thereof.

Examples of the surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K.K.); Florad FC430 and 431 (produced by Sumitomo 3M Inc.); Megaface F171, F173, F176, F189 and R08 (produced by Dainippon Ink & Chemicals, Inc.); Surflon S-382, SC101, 102, 103, 104, 105 and 106 (produced by Asahi Glass Co., Ltd.); and Troysol S-366 (produced by Troy Chemical). In addition, polysiloxane polymer KP-341 (produced by Shin-Etsu Chemical Co., Ltd.) may also be used as a silicon-containing surfactant.

Other than these known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene)) acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene)) acrylates (or methacrylates).

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene)) acrylate (or methacrylate), a copolymer of a $C_6F_{13}$ group-containing acrylate (or methacrylate) with a (poly(oxyethylene)) acrylate (or methacrylate) and a (poly(oxypropylene)) acrylate (or methacrylate), a copolymer of a $C_8F_{17}$ group-containing acrylate (or methacrylate) with a (poly(oxyalkylene)) acrylate (or methacrylate), and a copolymer of a $C_8F_{17}$ group-containing acrylate (or methacrylate) with a (poly(oxyethylene)) acrylate (or methacrylate) and a (poly(oxypropylene)) acrylate (or methacrylate).

The amount of the surfactant used is preferably from 0.0001 to 2 mass %, more preferably from 0.001 to 1 mass %, based on the entire amount of the positive resist composition (excluding the solvent).

[5] Solvent

The resist composition of the present invention is dissolved in a solvent capable of dissolving respective components described above and then applied on a support. Usually, the solid content concentration of all resist components is preferably from 2 to 30 mass %, more preferably from 3 to 25 mass %.

Preferred examples of the solvent used here include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. These solvents may be used individually or in combination.

Propylene glycol monomethyl ether acetate is preferably contained as the solvent, and it is more preferred to further contain propylene glycol monomethyl ether.

[6] Other Additives

The positive resist composition of the present invention may further contain a photo-base generator and the like, if desired.

1. Photo-Base Generator

Examples of the photo-base generator which can be added to the composition of the present invention include compounds described in JP-A-4-151156, JP-A-4-162040, JP-A-5-197148, JP-A-5-5995, JP-A-6-194834, JP-A-8-146608, JP-A-10-83079 and European Patent 622,682. Specific examples of the photo-base generator which can be suitably used include 2-nitrobenzyl carbamate, 2,5-dinitrobenzylcyclohexyl carbamate, N-cyclohexyl-4-methylphenylsulfonamide and 1,1-dimethyl-2-phenylethyl-N-isopropyl carbamate. Such a photo-base generator is added for the purpose of improving the resist profile or the like.

2. Carboxylic Acid Generator (E)

A compound capable of generating a carboxylic acid upon irradiation with an actinic ray or radiation (hereinafter, sometimes referred to as a "compound (E)" or a "carboxylic acid generator") may also be used.

The carboxylic acid generator is preferably a compound represented by the following formula (E):

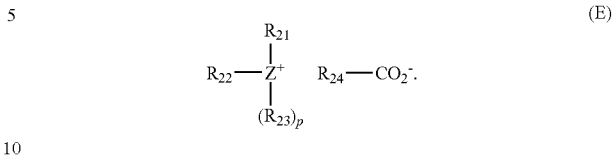

In formula (E), each of $R_{21}$ to $R_{23}$ independently represents an alkyl group, a cycloalkyl group, an alkenyl group or an aryl group, $R_{24}$ represents a hydrogen atom, an alkyl group, a cycloalkyl group, an alkenyl group or an aryl group, and Z represents a sulfur atom or an iodine atom. When Z is a sulfur atom, p is 1, and when Z is an iodine atom, p is 0.

In formula (E), each of $R_{21}$ to $R_{23}$ independently represents an alkyl group, a cycloalkyl group, an alkenyl group or an aryl group, and these groups may have a substituent.

Examples of the substituent which the alkyl group, cycloalkyl group and alkenyl group may have include a halogen atom (e.g., chlorine, bromine, fluorine), an aryl group (e.g., phenyl, naphthyl), a hydroxy group and an alkoxy group (e.g., methoxy, ethoxy, butoxy).

Examples of the substituent which the aryl group may have include a halogen atom (e.g., chlorine, bromine, fluorine), a nitro group, a cyano group, an alkyl group (e.g., methyl, ethyl, tert-butyl, tert-amyl, octyl), a hydroxy group and an alkoxy group (e.g., methoxy, ethoxy, butoxy).

Each of $R_{21}$ to $R_{23}$ is, independently, preferably an alkyl group having a carbon number of 1 to 12, a cycloalkyl group having a carbon number of 3 to 12, an alkenyl group having a carbon number of 2 to 12, or an aryl group having a carbon number of 6 to 24, more preferably an alkyl group having a carbon number of 1 to 6, a cycloalkyl group having a carbon number of 3 to 6, or an aryl group having a carbon number of 6 to 18, still more preferably an aryl group having a carbon number of 6 to 15, and each of these groups may have a substituent.

$R_{24}$ represents a hydrogen atom, an alkyl group, a cycloalkyl group, an alkenyl group or an aryl group.

Examples of the substituent which the alkyl group, cycloalkyl group and alkenyl group may have are the same as those of the substituent described above when $R_{21}$ is an alkyl group.

Examples of the substituent of the aryl group are the same as those of the substituent described above when $R_{21}$ is an aryl group.

$R_{24}$ is preferably a hydrogen atom, an alkyl group having a carbon number of 1 to 30, a cycloalkyl group having a carbon number of 3 to 30, an alkenyl group having a carbon number of 2 to 30, or an aryl group having a carbon number of 6 to 24, more preferably an alkyl group having a carbon number of 1 to 18, a cycloalkyl group having a carbon number of 3 to 18, or an aryl group having a carbon number of 6 to 18, still more preferably an alkyl group having a carbon number of 1 to 12, a cycloalkyl group having a carbon number of 3 to 12, or an aryl group having a carbon number of 6 to 15. Each of these groups may have a substituent.

Z represents a sulfur atom or an iodine atom. p is 1 when Z is a sulfur atom, and 0 when Z is an iodine atom.

Incidentally, two or more cation moieties of formula (E) may combine through a single bond or a linking group (e.g., —S—, —O—) to form a cation structure having a plurality of cation moieties of formula (E).

Specific preferred examples of the (E) compound capable of generating a carboxylic acid upon irradiation with an actinic ray or radiation are set forth below, but the present invention is of course not limited thereto.

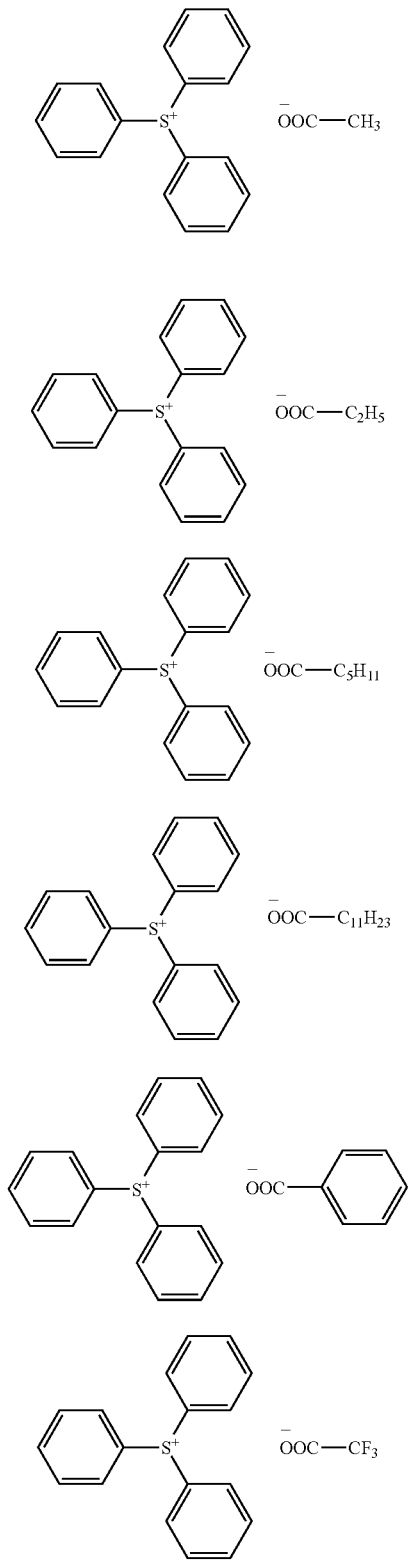

The content of the compound (E) in the positive resist composition of the present invention is preferably from 0 to 10 mass %, more preferably from 0 to 5 mass %, still more preferably from 0 to 3 mass %, based on the entire solid content of the composition. One kind of such a compound capable of generating a carboxylic acid upon irradiation with an actinic ray or radiation may be used, or two or more kinds thereof may be mixed and used.

3. Antioxidant

The resist composition of the present invention may contain an antioxidant.

The antioxidant is added for preventing the organic material from being oxidized in the presence of oxygen.

The antioxidant is not particularly limited as long as it is an antioxidant used in general and has an effect of preventing oxidation of a plastic and the like, and examples thereof include a phenol-based antioxidant, an antioxidant composed of an organic acid derivative, a sulfur-containing antioxidant, an amine-based antioxidant, an antioxidant composed of an amine-aldehyde condensate, and an antioxidant composed of an amine-ketone condensate. Out of these antioxidants, in order to bring out the effects of the present invention without reducing the functions of the resist, the antioxidant is preferably a phenol-based antioxidant or an antioxidant composed of an organic acid derivative.

Examples of the phenol-based antioxidant include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butyl.hydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethylamino-p-cresol, 6-(4-hydroxy-3,5-di-tert-butyl.anilino)2,4-bis.octyl-thio-1,3,5-triazine, n-octadecyl-3-(4'-hydroxy-3',5'-di-tert-butyl.phenyl)propionate, octylated phenol, aralkyl-substituted phenols, alkylated p-cresol and hindered phenol; bis-, tris- and poly-phenols such as 4,4'-dihydroxy.diphenyl, methylene.bis(dimethyl-4,6-phenol), 2,2'-methylene-bis-(4-methyl-6-tert-butylphenol), 2,2'-methylene-bis-(4-methyl-6-cyclohexyl.phenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-crosslinked polyvalent alkylphenol, 4,4'-butylidenebis-(3-methyl-6-tert-butylphenol), 1,1-bis-(4-hydroxyphenyl)-cyclohexane, 2,2'-dihydroxy-3,3'-di-(α-methylcyclohexyl)-5,5'-dimethyl.diphenylmethane, alkylated bisphenol, hindered bisphenol, 1,3,5-trimethyl-2,4,6-tris(3,5-di-tert-butyl-4-hydroxybenzyl)benzene, tris-(2-methyl-4-hydroxy-5-tert-butylphenyl)butane, and tetrakis-[methylene-3-(3',5'-di-tert-butyl-4'-hydroxyphenyl)propionate]methane.

Specific preferred examples of the antioxidant for use in the present invention include 2,6-di-tert-butyl-4-methylphenol, 4-hydroxymethyl-2,6-di-tert-butylphenol, 2,2'-methylenebis(4-methyl-6-tert-butylphenol), butylhydroxyanisole, tert-butylhydroquinone, 2,4,5-trihydroxybutyrophenone, nordihydroguajaretic acid, propyl gallate, octyl gallate, lauryl gallate and isopropyl citrate. Among these, 2,6-di-tert-butyl-4-methylphenol, 4-hydroxymethyl-2,6-di-tert-butylphenol, butylhydroxyanisole and tert-butylhydroquinone are preferred, and 2,6-di-tert-butyl-4-methylphenol and 4-hydroxymethyl-2,6-di-tert-butylphenol are more preferred.

The content of the antioxidant in the chemical amplification resist composition is preferably 1 ppm or more, more preferably 5 ppm or more, still more preferably 10 ppm or more, yet still more preferably 50 ppm or more, even yet still more preferably 100 ppm or more, and in particular, preferably from 100 to 10,000 ppm. A plurality of antioxidants may be mixed and used.

[7] Film Formation

The positive resist composition of the present invention is applied on a substrate to form a thin film. The thickness of this coating film is preferably from 0.05 to 4.0 μm.

An antireflection film may be provided as an underlayer of the resist. The antireflection film may be either an inorganic film type such as titanium, titanium dioxide, titanium nitride, chromium oxide, carbon and amorphous silicon, or an organic film type composed of a light absorber and a polymer material. The former requires equipment for film formation, such as vacuum deposition apparatus, CVD apparatus and sputtering apparatus. Examples of the organic antireflection film include a film composed of a diphenylamine derivative/formaldehyde-modified melamine resin condensate, an alkali-soluble resin and a light absorber described in JP-B-7-69611 (the term "JP-B" as used herein means an "examined Japanese patent publication"), a reaction product of a maleic anhydride copolymer and a diamine-type light absorber described in U.S. Pat. No. 5,294,680, a film containing a resin binder and a methylolmelamine-based thermal crosslinking agent described in JP-A-6-118631, an acrylic resin-type antireflection film containing a carboxylic acid group, an epoxy group and a light absorbing group within the same molecule described in JP-A-6-118656, a film composed of a methylolmelamine and a benzophenone-based light absorber described in JP-A-8-87115, and a film obtained by adding a low molecular light absorber to a polyvinyl alcohol resin described in JP-A-8-179509.

Also, the organic antireflection film may be a commercially available organic antireflection film such as DUV30 Series and DUV-40 Series produced by Brewer Science, Inc., and AR-2, AR-3 and AR-5 produced by Shipley Co., Ltd.

If desired, an antireflection film may be used as an overlayer of the resist.

Examples of this antireflection film include AQUATAR-II, AQUATAR-III and AQUATAR-VII produced by AZ Electronic Materials.

In the production or the like of a precision integrated circuit device, the step of forming a pattern on a resist film is performed by applying the positive resist composition of the present invention on a substrate (for example, a silicon/silicon dioxide-coated substrate, a glass substrate, an ITO substrate or a quartz/chromium oxide-coated substrate) to form a resist film, irradiating thereon an actinic ray or radiation such as KrF excimer laser light, electron beam and EUV light, and then subjecting the resist film to heating, development, rinsing and drying, whereby a good resist pattern can be formed.

The alkali developer which can be used in the development is an aqueous solution of alkalis (usually from 0.1 to 20 mass %) such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimetylethanolamine, triethanolamine), quaternary ammonium salts (e.g., tetramethylammonium hydroxide, tetraethylammonium hydroxide, choline) and cyclic amines (e.g., pyrrole, piperidine). This aqueous solution of alkalis may be used after adding thereto an appropriate amount of alcohols such as isopropyl alcohol or a surfactant such as nonionic surfactant.

Among these developers, a quaternary ammonium salt is preferred, and tetramethylammonium hydroxide and choline are more preferred.

The pH of the alkali developer is usually from 10 to 15.

Examples

The present invention is described in greater detail below by referring to Examples, but the present invention should not be construed as being limited thereto.

Synthesis Example 1

Synthesis of Polymer (A-6-1)

600 Gram of ethylene glycol monoethyl ether acetate was charged into a 2 L-volume flask, and nitrogen displacement was performed at a flow rate of 100 mL/min for 1 hour. Separately, 105.4 g (0.65 mol) of 4-acetoxystyrene, 35.6 g (0.25 mol) of tert-butyl methacrylate, 17.6 g (0.10 mol) of benzyl methacrylate and 2.30 g (0.01 mol) of polymerization initiator V-601 (produced by Wako Pure Chemical Industries, Ltd.) were dissolved in 200 g of ethylene glycol monoethyl ether acetate, and the obtained solution was subjected to nitrogen displacement in the same manner as above.

The temperature of the 2 L-volume flask containing ethylene glycol monoethyl ether acetate was raised until the inner temperature became 80° C., and 2.30 g (0.01 mol) of polymerization initiator V-601 was further added thereto. After stirring for 5 minutes, the monomer mixed solution prepared above was added dropwise with stirring over 6 hours. After the dropwise addition, the solution was further stirred under heating for 2 hours. Thereafter, the reaction solution was cooled to room temperature and added dropwise in 3 L of hexane to precipitate a polymer. The solid collected by filtration was dissolved in 500 ml of acetone, the resulting solution was again added dropwise in 3 L of hexane, and the solid collected by filtration was dried under reduced pressure to obtain 151 g of a 4-acetoxystyrene/tert-butyl methacrylate/benzyl methacrylate copolymer.

In a reaction vessel, 40.00 g of the polymer obtained above, 40 ml of methanol, 200 ml of 1-methoxy-2-propanol and 1.5 ml of concentrated hydrochloric acid were added. The resulting mixture was heated at 80° C. and stirred for 5 hours. The reaction solution was left standing to cool to room temperature and added dropwise in 3 L of distilled water. The solid collected by filtration was dissolved in 200 ml of acetone, the resulting solution was again added dropwise in 3 L of distilled water, and the solid collected by filtration was dried under reduced pressure to obtain 35.5 g of Polymer (A-6). The weight average molecular weight by GPC was 15,000, and the molecular weight polydispersity (Mw/Mn) was 1.58.

Synthesis Example 2

Synthesis of Polymer (A-4)

600 Gram of ethylene glycol monoethyl ether acetate was charged into a 2 L-volume flask, and nitrogen displacement was performed at a flow rate of 100 mL/min for 1 hour. Separately, 105.4 g (0.65 mol) of 4-acetoxystyrene, 35.6 g (0.25 mol) of tert-butyl methacrylate, 16.0 g (0.10 mol) of phenyl methacrylate and 2.30 g (0.01 mol) of polymerization initiator V-601 (produced by Wako Pure Chemical Industries, Ltd.) were dissolved in 200 g of ethylene glycol monoethyl ether acetate, and the obtained solution was subjected to nitrogen displacement in the same manner as above.

The temperature of the 2 L-volume flask containing ethylene glycol monoethyl ether acetate was raised until the inner temperature became 80° C., and 2.30 g (0.01 mol) of polymerization initiator V-601 was further added thereto. After stirring for 5 minutes, the monomer mixed solution prepared above was added dropwise with stirring over 6 hours. After the dropwise addition, the solution was further stirred under heating for 2 hours. Thereafter, the reaction solution was cooled to room temperature and added dropwise in 3 L of hexane to precipitate a polymer. The solid collected by filtration was dissolved in 500 ml of acetone, the resulting solution was again added dropwise in 3 L of hexane, and the solid collected by filtration was dried under reduced pressure to obtain 149 g of a 4-acetoxystyrene/tert-butyl methacrylate/phenyl methacrylate copolymer.

40.00 Gram of the polymer obtained above was dissolved in 200 ml of tetrahydrofuran, and 5 ml of an aqueous 2.38 mass % tetramethylammonium hydroxide solution was added thereto. After stirring at room temperature for 1 hour, distilled water was added thereto to precipitate a polymer. The precipitate was washed with distilled water and then dried under reduced pressure. The obtained polymer was dissolved in 100 ml of ethyl acetate and after adding hexane thereto, the precipitated polymer was dried under reduced pressure to obtain 35.1 g of Polymer (A-4) as a powder material. The weight average molecular weight by GPC was 15,500, and the molecular weight polydispersity (Mw/Mn) was 1.51.

Resins shown in Table 1 having structures exemplified above were synthesized in the same manner as in Synthesis Examples 1 and 2 except for changing the monomers used.

The compositional ratio, weight average molecular weight (Mw) and molecular weight polydispersity (Mw/Mn) of each resin are shown in Table 1. The compositional ratio (by mol) is a ratio of repeating units in order from the left in the structure of the resin illustrated above by the symbol shown in Table 1. Incidentally, the structures of Resins A-1-1 and A-1-2 come under A-1, the structures of Resins A-6-1, A-6-2 and A-6-3 come under A-6, and the structures of Resins Z-1-1 and Z-1-2 come under Z-1, and the compositional ratio, molecular weight or polydispersity differs from each other between or among the structures.

TABLE 1

| Resin | Compositional Ratio (mol %) | | | Mw | Mw/Mn |
|---|---|---|---|---|---|
| A-1-1 | 65 | 25 | 10 | 15000 | 1.58 |
| A-1-2 | 60 | 30 | 10 | 8000 | 1.55 |
| A-2 | 65 | 25 | 10 | 14800 | 1.60 |
| A-4 | 65 | 25 | 10 | 15500 | 1.51 |
| A-6-1 | 65 | 25 | 10 | 15000 | 1.58 |
| A-6-2 | 65 | 25 | 10 | 20000 | 1.58 |
| A-6-3 | 65 | 25 | 10 | 30000 | 1.61 |
| A-8 | 65 | 25 | 10 | 13500 | 1.60 |
| A-9 | 65 | 25 | 10 | 15000 | 1.58 |
| A-11 | 70 | 20 | 10 | 15000 | 1.58 |
| Z-1-1 | 65 | 15 | 20 | 15000 | 1.58 |
| Z-1-2 | 60 | 20 | 20 | 8000 | 1.55 |
| Z-2 | 60 | 20 | 20 | 15000 | 1.60 |

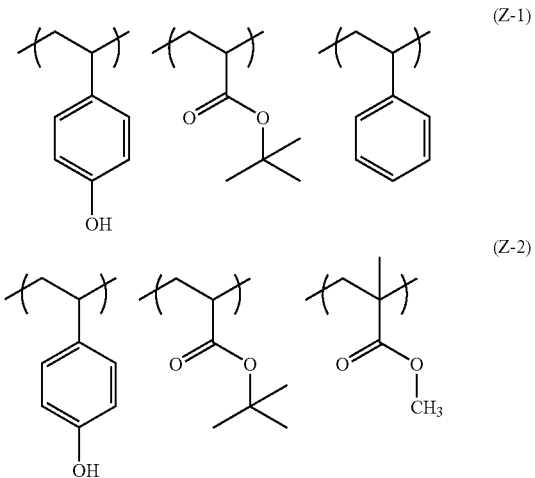

[Preparation of Resist Composition]

A resin, an acid generator, an organic basic compound and a surfactant were dissolved in a mixed solvent or a single solvent of propylene glycol monomethyl ether acetate (hereinafter simply referred to as "PGMEA") and propylene glycol monomethyl ether (hereinafter simply referred to as "PGME") to prepare a solution having a solid content concentration of 10.0 mass %, and the obtained solution was microfiltered through a membrane filter having a pore size of 0.1 μm to obtain a resist solution.

The resist solutions used in evaluation are shown in Table 2. Here, the amount added (mass %) of each component means mass % based on the solid content excluding the solvent.

[Production and Evaluation of Pattern (KrF)]

The positive resist solution prepared as above was uniformly applied on a substrate coated with a 60 nm-thick antireflection film (DUV42, produced by Brewer Science, Inc.), by using a spin coater, Mark 8, manufactured by Tokyo Electron Ltd. and baked at 120° C. for 90 seconds to obtain a 0.4 μm-thick positive resist film. The obtained resist film was subjected to pattern exposure using a KrF excimer laser scanner (PAS5500/850C, manufactured by ASML, wavelength: 248 nm) under the exposure conditions of NA=0.68 and σ=0.60. After the irradiation, the resist film was baked at 120° C. for 90 seconds, then dipped in an aqueous 2.38 mass % tetramethylammonium hydroxide (TMAH) solution for 60 seconds, rinsed with water for 30 seconds and dried. The obtained pattern was evaluated by the following methods. The results obtained are shown in Table 2.

(Defocus Margin (iL_DOF) of Isolated Line Pattern)

The exposure dose capable of giving a 180-nm resist pattern by using a mask pattern having a mask size of 180 nm and a pitch of 1,980 nm under the conditions of focus=0.0 μm was confirmed. The focus was fluctuated from −0.5 μm to 0.5 μm by using the exposure dose above and at this time, the focus range allowing the resist pattern size to fall in the range from 162 nm to 198 nm is defined as iL_DOF (μm).

(Mask Error Enhancement Factor (MEEF))

The mask size was changed from 170 nm to 190 nm while fixing the pitch to 360 nm by using an exposure dose capable of giving a 180-nm resist pattern with a mask pattern having a mask size of 180 nm and a pitch 360 nm and at this time, the gradient of change in the size of the resist pattern is defined as MEEF. A value closer to 1 indicates better performance as a resist.

(Profile)

The profile of a pattern obtained using a mask pattern having a mask size of 180 nm and a pitch of 360 nm was observed by cross-sectional SEM and evaluated on a scale of the following three grades.

1: The profile was rectangular.
2A: The profile was substantially rectangular but slightly tapered.
2B: The profile was substantially rectangular but slightly T-Top shaped.
3: The profile was clearly tapered or T-Top shaped.

(Residual Film Ratio (Plasma Etching Resistance))

A 0.4 μm-thick positive resist film was formed on a HMDS-treated wafer and then subjected to plasma etching using a mixed gas of $CF_4$ (10 mL/min), $O_2$ (20 mL/min) and Ar (1,000 mL/min) under the conditions of a temperature of 23° C. for 30 seconds. Thereafter, the residual film amount of the resist film was measured, and the value obtained by dividing the measured value by the original film thickness of 0.4 μm and multiplying the result by 100 is defined as the residual film ratio (%). A larger residual film ratio indicates higher plasma etching resistance.

(Defect)

A 0.18-μm pattern was exposed at 78 portions in the wafer plane by using an exposure dose capable of giving a 180-nm resist pattern with a mask pattern having a mask size of 180 nm and a pitch of 360 nm. The obtained wafer with a pattern was measured for the number of development defects by using KLA-2360 manufactured by KLA Tencor Ltd. At this time, the inspection area was 205 $cm^2$ in total, the pixel size was 0.25 μm, the threshold was 30, and visible light was used as the inspection light. The value obtained by dividing the measured value by the inspection area was evaluated as the number of defects (pieces/$cm^2$).

TABLE 2

| | (A) Resin (mass %) | (B) Acid Generator (mass %) | (C) Basic Compound (mass %) | Surfactant (mass %) | Solvent PGMEA (mass %) | Solvent PGME (mass %) | Residual Film Ratio (%) | Number of Defects (pieces/$cm^2$) | iL_DOF (nm) | MEEF | Profile |
|---|---|---|---|---|---|---|---|---|---|---|---|
| Example 1 | A-1-1 (97.0) | B8 (2.5) | C-1 (0.4) | D-1 (0.1) | 80 | 20 | 94.0 | 0.15 | 0.45 | 2.5 | 1 |
| Example 2 | A-1-2 (97.0) | B8 (2.5) | C-1 (0.4) | D-1 (0.1) | 80 | 20 | 93.0 | 0.15 | 0.40 | 2.8 | 2A |
| Example 3 | A-1-2 (96.8) | B8 (2.5) | C-4 (0.6) | D-1 (0.1) | 80 | 20 | 93.0 | 0.15 | 0.45 | 2.6 | 1 |
| Example 4 | A-2 (97.0) | B8 (2.5) | C-1 (0.4) | D-1 (0.1) | 80 | 20 | 94.5 | 0.12 | 0.45 | 2.5 | 1 |
| Example 5 | A-4 (97.0) | B8 (2.5) | C-1 (0.4) | D-1 (0.1) | 80 | 20 | 95.5 | 0.11 | 0.40 | 2.4 | 1 |
| Example 6 | A-4 (97.5) | B10 (2.0) | C-2 (0.4) | D-2 (0.1) | 80 | 20 | 95.5 | 0.13 | 0.45 | 2.5 | 1 |
| Example 7 | A-4 (96.5) | B45 (3.0) | C-3 (0.4) | D-3 (0.1) | 80 | 20 | 95.5 | 0.15 | 0.45 | 2.5 | 1 |
| Example 8 | A-6-1 (97.0) | B8 (2.5) | C-2 (0.4) | D-1 (0.1) | 80 | 20 | 96.0 | 0.12 | 0.45 | 2.4 | 1 |
| Example 9 | A-6-1 (97.5) | B10 (2.0) | C-3 (0.4) | D-2 (0.1) | 80 | 20 | 96.0 | 0.13 | 0.45 | 2.6 | 1 |
| Example 10 | A-6-1 (95.5) | B41 (4.0) | C-1 (0.4) | D-3 (0.1) | 80 | 20 | 96.0 | 0.14 | 0.45 | 2.5 | 1 |
| Example 11 | A-6-1 (97.0) | B8 (2.5) | C-5 (0.4) | D-1 (0.1) | 80 | 20 | 96.0 | 0.12 | 0.45 | 2.4 | 1 |
| Example 12 | A-6-2 (97.5) | B10 (2.0) | C-3 (0.4) | D-2 (0.1) | 80 | 20 | 96.5 | 0.13 | 0.46 | 2.6 | 1 |
| Example 13 | A-6-2 (97.5) | B24 (2.0) | C-5 (0.4) | D-2 (0.1) | 80 | 20 | 97.0 | 0.13 | 0.46 | 2.4 | 1 |
| Example 14 | A-6-3 (95.5) | B41 (4.0) | C-1 (0.4) | D-3 (0.1) | 80 | 20 | 97.0 | 0.14 | 0.47 | 2.5 | 1 |
| Example 15 | A-6-3 (96.5) | B69 (3.0) | C-5 (0.4) | D-3 (0.1) | 80 | 20 | 97.0 | 0.14 | 0.47 | 2.4 | 1 |

TABLE 2-continued

|  | (A) Resin (mass %) | (B) Acid Generator (mass %) | (C) Basic Compound (mass %) | Surfactant (mass %) | Solvent PGMEA (mass %) | PGME (mass %) | Residual Film Ratio (%) | Number of Defects (pieces/cm$^2$) | iL DOF (nm) | MEEF | Pro file |
|---|---|---|---|---|---|---|---|---|---|---|---|
| Example 16 | A-8 (97.0) | B8 (2.5) | C-1 (0.4) | D-1 (0.1) | 80 | 20 | 95.0 | 0.12 | 0.40 | 2.5 | 1 |
| Example 17 | A-9 (97.0) | B8 (2.5) | C-1 (0.4) | D-1 (0.1) | 100 | 0 | 95.5 | 0.15 | 0.45 | 2.5 | 1 |
| Example 18 | A-11 (96.0) | B8/B42 (0.5/3.0) | C-1/C-4 (0.3/0.1) | D-1 (0.1) | 80 | 20 | 95.0 | 0.12 | 0.45 | 2.5 | 1 |
| Comparative Example 1 | Z-1-1 (97.0) | B8 (2.5) | C-1 (0.4) | D-1 (0.1) | 80 | 20 | 96.5 | 0.55 | 0.45 | 2.7 | 1 |
| Comparative Example 2 | Z-1-2 (97.0) | B8 (2.5) | C-1 (0.4) | D-1 (0.1) | 80 | 20 | 93.5 | 0.45 | 0.35 | 3.0 | 2B |
| Comparative Example 3 | Z-2 (97.0) | B8 (2.5) | C-1 (0.4) | D-1 (0.1) | 80 | 20 | 89.5 | 0.12 | 0.45 | 2.5 | 1 |

(Organic Basic Compound)
C-1: Dicyclohexylmethylamine
C-2: 2,4,6-Triphenylimidazole
C-3: Tetra-(n-butyl)ammonium hydroxide
C-4:

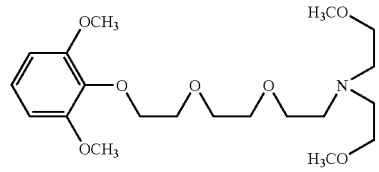

C-5: 1,8-Diazabicyclo[5.4.0]-7-undecene
(Surfactant)
D-1: Fluorine-containing surfactant, Megaface F-176 (produced by Dainippon Ink & Chemicals, Inc.)
D-2: Fluorine/silicon-containing surfactant, Megaface R08 (produced by Dainippon Ink & Chemicals, Inc.)
D-3: Silicon-containing surfactant, Siloxane Polymer KP341 (produced by Shin-Etsu Chemical Co., Ltd.)

[Production and Evaluation of Pattern (EB)]

The same resist solution as used in Production and Evaluation of Pattern (KrF) except for changing the solid content concentration to 8 mass % was applied on a hexamethyldisilazane-treated silicon wafer by using a spin coater, Mark 8, manufactured by Tokyo Electron Ltd. and baked at 120° C. for 60 seconds to obtain a film having an average thickness of 0.3 μm.

This resist film was irradiated with an electron beam by using an electron beam image-drawing apparatus (HL750, manufactured by Hitachi Ltd., accelerating voltage: 50 KeV). After the irradiation, the resist film was baked at 130° C. for 60 seconds, then dipped in an aqueous 2.38 mass % tetramethylammonium hydroxide (TMAH) solution for 60 seconds, rinsed with water for 30 seconds and dried. The obtained pattern was evaluated by the following methods. The results obtained are shown in Table 3.

(Resolution)

The line width of the pattern obtained was observed using a scanning electron microscope (S-9260, manufactured by Hitachi, Ltd.), and the irradiation energy for resolving a 0.15-μm line (line:space=1:1) was defined as the sensitivity. With respect to a pattern of line:space=1:1, to what μm was resolved with the irradiation energy giving the sensitivity above was observed by the above-described scanning electron microscope.

(Defect)

A 0.15-μm line of line:space=1:1 was patterned by performing the electron beam irradiation with the irradiation energy giving the sensitivity above and performing the baking and development in the same manner as above, and the number of defects (pieces/cm$^2$) was observed by the above-described scanning electron microscope at 100 portions having an area of 3 μm by 3 μm.

(Residual Film Ratio (Plasma Etching Resistance))

The residual film ratio was measured in the same manner as in the KrF exposure except for changing the film thickness.

TABLE 3

|  | (A) Resin (mass %) | (B) Acid Generator (mass %) | (C) Basic Compound (mass %) | Surfactant (mass %) | Solvent PGMEA (mass %) | PGME (mass %) | Residual Film Ratio (%) | Number of Defects (pieces/cm$^2$) | Resolution (μm) |
|---|---|---|---|---|---|---|---|---|---|
| Example 19 | A-1-1 (97.0) | B8 (2.5) | C-1 (0.4) | D-1 (0.1) | 80 | 20 | 94.0 | 2 | 0.08 |
| Example 20 | A-1-2 (97.0) | B8 (2.5) | C-1 (0.4) | D-1 (0.1) | 80 | 20 | 93.0 | 2 | 0.10 |

TABLE 3-continued

|  | (A) Resin (mass %) | (B) Acid Generator (mass %) | (C) Basic Compound (mass %) | Surfactant (mass %) | Solvent PGMEA (mass %) | Solvent PGME (mass %) | Residual Film Ratio (%) | Number of Defects (pieces/cm²) | Resolution (μm) |
|---|---|---|---|---|---|---|---|---|---|
| Example 21 | A-1-2 (96.8) | B8 (2.5) | C-4 (0.6) | D-1 (0.1) | 80 | 20 | 93.0 | 2 | 0.09 |
| Example 22 | A-2 (97.0) | B8 (2.5) | C-1 (0.4) | D-1 (0.1) | 80 | 20 | 94.5 | 2.5 | 0.09 |
| Example 23 | A-4 (97.0) | B8 (2.5) | C-1 (0.4) | D-1 (0.1) | 80 | 20 | 95.5 | 1.5 | 0.08 |
| Example 24 | A-4 (97.5) | B10 (2.0) | C-2 (0.4) | D-2 (0.1) | 80 | 20 | 95.5 | 2 | 0.09 |
| Example 25 | A-4 (96.5) | B45 (3.0) | C-3 (0.4) | D-3 (0.1) | 80 | 20 | 95.5 | 1 | 0.09 |
| Example 26 | A-6-1 (97.0) | B8 (2.5) | C-2 (0.4) | D-1 (0.1) | 80 | 20 | 96.0 | 2 | 0.08 |
| Example 27 | A-6-1 (97.5) | B10 (2.0) | C-3 (0.4) | D-2 (0.1) | 80 | 20 | 96.0 | 1.5 | 0.08 |
| Example 28 | A-6-1 (95.5) | B41 (4.0) | C-1 (0.4) | D-3 (0.1) | 80 | 20 | 96.0 | 2 | 0.09 |
| Example 29 | A-6-1 (97.0) | B8 (2.5) | C-5 (0.4) | D-1 (0.1) | 80 | 20 | 96.0 | 2 | 0.08 |
| Example 30 | A-6-2 (97.5) | B10 (2.0) | C-3 (0.4) | D-2 (0.1) | 80 | 20 | 96.5 | 1.5 | 0.08 |
| Example 31 | A-6-2 (97.5) | B24 (2.0) | C-5 (0.4) | D-2 (0.1) | 80 | 20 | 96.5 | 1.5 | 0.07 |
| Example 32 | A-6-3 (95.5) | B41 (4.0) | C-1 (0.4) | D-3 (0.1) | 80 | 20 | 96.7 | 2 | 0.08 |
| Example 33 | A-6-3 (96.5) | B69 (3.0) | C-5 (0.4) | D-3 (0.1) | 80 | 20 | 96.7 | 2 | 0.07 |
| Example 34 | A-8 (97.0) | B8 (2.5) | C-1 (0.4) | D-1 (0.1) | 80 | 20 | 95.0 | 2 | 0.09 |
| Example 35 | A-9 (97.0) | B8 (2.5) | C-1 (0.4) | D-1 (0.1) | 100 | 0 | 95.5 | 2 | 0.08 |
| Example 36 | A-11 (96.0) | B8/B42 (0.5/3.0) | C-1 (0.4) | D-1 (0.1) | 80 | 20 | 95.0 | 2.5 | 0.08 |
| Comparative Example 4 | Z-1-1 (97.0) | B8 (2.5) | C-1 (0.4) | D-1 (0.1) | 80 | 20 | 96.5 | 10 | 0.09 |
| Comparative Example 5 | Z-1-2 (97.0) | B8 (2.5) | C-1 (0.4) | D-1 (0.1) | 80 | 20 | 93.5 | 6 | 0.11 |
| Comparative Example 6 | Z-2 (97.0) | B8 (2.5) | C-1 (0.4) | D-1 (0.1) | 80 | 20 | 89.5 | 1.5 | 0.09 |

[Production and Evaluation of Pattern (EUV)]

The same resist solution as used in Production and Evaluation of Pattern (KrF) except for changing the solid content concentration to 6 mass % was applied on a hexamethyldisilazane-treated silicon wafer by using a spin coater, Mark 8, manufactured by Tokyo Electron Ltd. and baked at 120° C. for 60 seconds to obtain a film having an average thickness of 0.15 μm.

This resist film was exposed with EUV light (EUVES, produced by Litho Track Japan Corporation, wavelength: 13 nm) by varying the exposure dose in steps of 0.5 mJ in the range from 0 to 20.0 mJ and baked at 130° C. for 90 seconds. Thereafter, the dissolution rate at each exposure dose was measured using an aqueous 2.38 mass % tetramethylammonium hydroxide (TMAH) solution to obtain a sensitivity curve. The results obtained are shown in Table 4.

(Sensitivity and Resolution (Dissolution Contrast))

In this sensitivity curve, the exposure dose when the dissolution rate of the resist is saturated was taken as the sensitivity and also, the dissolution contrast (γ value) indicative of the resolution was calculated from the gradient of the straight line part in the sensitivity curve. As the γ value is larger, the dissolution contrast is more excellent and the resolution is higher.

(Residual Film Ratio (Plasma Etching Resistance))

The residual film ratio was measured in the same manner as in the KrF exposure except for changing the film thickness.

(Development Defect)

Exposure with the exposure dose giving the above-described sensitivity and the same baking and development as above were performed, and the number of defects (pieces/cm²) was observed by the above-described scanning electron microscope at 100 portions having an area of 3 μm by 3 μm at the boundary between the exposed area and the unexposed area.

TABLE 4

|  | (A) Resin (mass %) | (B) Acid Generator (mass %) | (C) Basic Compound (mass %) | Surfactant (mass %) | Solvent PGMEA (mass %) | Solvent PGME (mass %) | Residual Film Ratio (%) | Number of Defects (pieces/cm²) | Resolution γ value |
|---|---|---|---|---|---|---|---|---|---|
| Example 37 | A-1-1 (97.0) | B8 (2.5) | C-1 (0.4) | D-1 (0.1) | 80 | 20 | 94.0 | 1 | 6.3 |

TABLE 4-continued

| | (A) Resin (mass %) | (B) Acid Generator (mass %) | (C) Basic Compound (mass %) | Surfactant (mass %) | Solvent PGMEA (mass %) | Solvent PGME (mass %) | Residual Film Ratio (%) | Number of Defects (pieces/cm²) | Resolution γ value |
|---|---|---|---|---|---|---|---|---|---|
| Example 38 | A-1-2 (97.0) | B8 (2.5) | C-1 (0.4) | D-1 (0.1) | 80 | 20 | 93.0 | 1 | 5.5 |
| Example 39 | A-1-2 (96.8) | B8 (2.5) | C-4 (0.6) | D-1 (0.1) | 80 | 20 | 93.0 | 1 | 6.0 |
| Example 40 | A-2 (97.0) | B8 (2.5) | C-1 (0.4) | D-1 (0.1) | 80 | 20 | 94.5 | 1.5 | 6.2 |
| Example 41 | A-4 (97.0) | B8 (2.5) | C-1 (0.4) | D-1 (0.1) | 80 | 20 | 95.5 | 0.5 | 6.5 |
| Example 42 | A-4 (97.5) | B10 (2.0) | C-2 (0.4) | D-2 (0.1) | 80 | 20 | 95.5 | 1 | 6.2 |
| Example 43 | A-4 (96.5) | B45 (3.0) | C-3 (0.4) | D-3 (0.1) | 80 | 20 | 95.5 | 1 | 6.5 |
| Example 44 | A-6-1 (97.0) | B8 (2.5) | C-2 (0.4) | D-1 (0.1) | 80 | 20 | 96.0 | 1 | 6.3 |
| Example 45 | A-6-1 (97.5) | B10 (2.0) | C-3 (0.4) | D-2 (0.1) | 80 | 20 | 96.0 | 1.5 | 6.3 |
| Example 46 | A-6-1 (95.5) | B41 (4.0) | C-1 (0.4) | D-3 (0.1) | 80 | 20 | 96.0 | 1 | 6.2 |
| Example 47 | A-6-1 (97.0) | B8 (2.5) | C-5 (0.4) | D-1 (0.1) | 80 | 20 | 96.0 | 1 | 6.3 |
| Example 48 | A-6-2 (97.5) | B 10 (2.0) | C-3 (0.4) | D-2 (0.1) | 80 | 20 | 96.5 | 1.5 | 6.3 |
| Example 49 | A-6-2 (97.5) | B24 (2.0) | C-5 (0.4) | D-2 (0.1) | 80 | 20 | 96.5 | 1.5 | 5.2 |
| Example 50 | A-6-3 (95.5) | B41 (4.0) | C-1 (0.4) | D-3 (0.1) | 80 | 20 | 97.0 | 1 | 6.2 |
| Example 51 | A-6-3 (96.5) | B69 (3.0) | C-5 (0.4) | D-3 (0.1) | 80 | 20 | 97.0 | 1 | 5.5 |
| Example 52 | A-8 (97.0) | B8 (2.5) | C-1 (0.4) | D-1 (0.1) | 80 | 20 | 95.0 | 1 | 6.0 |
| Example 53 | A-9 (97.0) | B8 (2.5) | C-1 (0.4) | D-1 (0.1) | 100 | 0 | 95.5 | 1 | 6.5 |
| Example 54 | A-11 (96.0) | B8/B42 (0.5/3.0) | C-1 (0.4) | D-1 (0.1) | 80 | 20 | 95.0 | 1.5 | 6.0 |
| Comparative Example 7 | Z-1-1 (97.0) | B8 (2.5) | C-1 (0.4) | D-1 (0.1) | 80 | 20 | 96.5 | 10 | 6.5 |
| Comparative Example 8 | Z-1-2 (97.0) | B8 (2.5) | C-1 (0.4) | D-1 (0.1) | 80 | 20 | 93.5 | 4.5 | 4.5 |
| Comparative Example 9 | Z-2 (97.0) | B8 (2.5) | C-1 (0.4) | D-1 (0.1) | 80 | 20 | 89.5 | 1.5 | 5.8 |

As seen from the results, the resist composition of the present invention can satisfy all of the plasma etching resistance, defect performance, high resolution, good pattern profile and sufficient depth of focus at the same time.

INDUSTRIAL APPLICABILITY

According to the resist composition and pattern forming method of the present invention, a resist composition ensuring high resolution, good pattern profile, sufficient depth of focus, little defects after development, and excellent plasma etching resistance is provided. The pattern forming method of the present invention is suitably used in the production process of a semiconductor such as IC or in the lithography process for the production of a circuit board of liquid crystal, thermal head and the like or for other photofabrications While the invention has been described in detail and with reference to specific embodiments thereof, it will be apparent to one skilled in the art that various changes and modifications can be made therein without departing from the spirit and scope thereof.

This application is based on Japanese Patent Application (Patent Application No. 2007-209398) filed on Aug. 10, 2007, and Japanese Patent Application (Patent Application No. 2008-062943) filed on Mar. 12, 2008, the contents of which are incorporated herein by way of reference.

The invention claimed is:

1. A positive resist composition comprising:
   (A) a resin which contains all of the repeating units represented by formulae (I)-a, (II) and (III), and becomes soluble in an alkali developer by the action of an acid; and
   (B) a compound capable of generating an acid upon irradiation with an actinic ray or radiation:

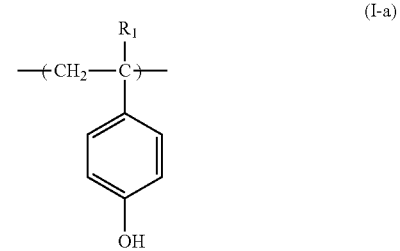

-continued

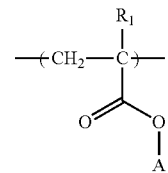
(II)

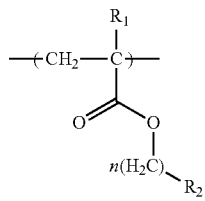
(III)

wherein
A represents a group capable of decomposing and leaving by the action of an acid,
each $R_1$ independently represents a hydrogen atom or a methyl group,
$R_2$ represents a phenyl group or a cyclohexyl group, and n represents an integer of 0 to 2.

2. The positive resist composition as claimed in claim 1, wherein
the repeating unit represented by formula (II) is a structure represented by formula (II)-a:

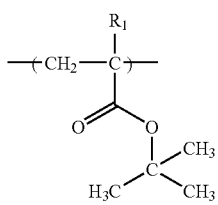
(II)-a wherein $R_1$ represents a hydrogen atom or a methyl group.

3. The positive resist composition as claimed in claim 1, wherein
$R_2$ in formula (III) is a phenyl group.

4. The positive resist composition as claimed in claim 2, wherein
$R_2$ in formula (III) is a phenyl group.

5. The positive resist composition as claimed in claim 1, wherein
the mass average molecular weight of the resin as the component (A) is 10,000 or more.

6. The positive resist composition as claimed in claim 5, wherein
the mass average molecular weight of the resin as the component (A) is from 10,000 to 25,000.

7. The positive resist composition as claimed in claim 1, wherein
the solid content concentration of all resist components is from 3 to 25 mass %.

8. The positive resist composition as claimed in claim 1, wherein
(A) the resin contains only the repeating units represented by formulae (I)-a, (II) and (III).

9. A pattern forming method comprising: forming a resist film from the resist composition claimed in claim 1, and exposing and developing the resist film.

10. A pattern forming method comprising: forming a resist film from the resist composition claimed in claim 2, and exposing and developing the resist film.

11. A pattern forming method comprising: forming a resist film from the resist composition claimed in claim 3, and exposing and developing the resist film.

12. A pattern forming method comprising: forming a resist film from the resist composition claimed in claim 4, and exposing and developing the resist film.

13. A pattern forming method comprising: forming a resist film from the resist composition claimed in claim 5, and exposing and developing the resist film.

14. A pattern forming method comprising: forming a resist film from the resist composition claimed in claim 6, and exposing and developing the resist film.

15. A pattern forming method comprising: forming a resist film from the resist composition claimed in claim 7, and exposing and developing the resist film.

16. A pattern forming method comprising: forming a resist film from the resist composition claimed in claim 8, and exposing and developing the resist film.

17. A resist film which is formed from the resist composition claimed in claim 1.

* * * * *